(12) United States Patent
Hieda

(10) Patent No.: US 7,759,174 B2
(45) Date of Patent: Jul. 20, 2010

(54) METHOD OF MANUFACTURING A SEMICONDUCTOR DEVICE

(75) Inventor: Katsuhiko Hieda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 635 days.

(21) Appl. No.: 11/657,088

(22) Filed: Jan. 24, 2007

(65) Prior Publication Data

US 2007/0122946 A1  May 31, 2007

Related U.S. Application Data

(62) Division of application No. 11/085,197, filed on Mar. 22, 2005, now Pat. No. 7,180,121.

(30) Foreign Application Priority Data

Mar. 25, 2004 (JP) ............................ 2004-089477

(51) Int. Cl.
*H01L 21/8232* (2006.01)
*H01L 21/335* (2006.01)

(52) U.S. Cl. ...................... 438/142; 438/259; 438/270; 438/524

(58) Field of Classification Search ...................... None
See application file for complete search history.

(56) References Cited

U.S. PATENT DOCUMENTS

| | | |
|---|---|---|
| 5,371,024 A | 12/1994 | Hieda et al. |
| 6,391,719 B1 | 5/2002 | Lin et al. |
| 6,548,861 B2 | 4/2003 | Palm et al. |
| 6,717,205 B2 | 4/2004 | Gratz |
| 6,764,904 B1 * | 7/2004 | Liu et al. .................... 438/259 |

(Continued)

FOREIGN PATENT DOCUMENTS

JP     05-291586     11/1993

(Continued)

OTHER PUBLICATIONS

Final Notice of Rejection issued by the Japanese Patent Office on Dec. 16, 2008, for Japanese Patent Application No. 2004-089477, and English-language translation thereof.

(Continued)

*Primary Examiner*—Kiesha R Bryant
*Assistant Examiner*—Khanh B Duong
(74) *Attorney, Agent, or Firm*—Finnegan, Henderson, Farabow, Garrett & Dunner, L.L.P.

(57) ABSTRACT

A semiconductor device includes a substrate including a semiconductor and a trench, and an electrically rewritable semiconductor memory cell on the substrate, the semiconductor memory cell comprising a charge storage layer including an upper surface and a lower surface, an area of the lower surface being smaller than an area of the upper surface, and at least a part of the charge storage layer being provided in the trench, first insulating layer between the lower surface of the charge storage layer and a bottom surface of the trench, second insulating layer between a side surface of the trench and a side surface of the charge storage layer and between the side surface of the trench and a side surface of the first insulating layer, third insulating layer on the charge storage layer, and a control gate electrode on the third insulating layer.

7 Claims, 30 Drawing Sheets

U.S. PATENT DOCUMENTS

| | | | |
|---|---|---|---|
| 6,958,513 B2 * | 10/2005 | Wang | 257/330 |
| 7,060,559 B2 | 6/2006 | Ozawa et al. | |
| 2002/0132421 A1 | 9/2002 | Schrems | |
| 2003/0209767 A1 | 11/2003 | Takahashi et al. | |
| 2004/0080020 A1 | 4/2004 | Mori et al. | |
| 2004/0183118 A1 | 9/2004 | Chen et al. | |
| 2005/0285182 A1 | 12/2005 | Schuler | |

FOREIGN PATENT DOCUMENTS

| | | |
|---|---|---|
| JP | 2755592 | 3/1998 |
| JP | 2877463 | 1/1999 |
| JP | 2000-49334 | 2/2000 |
| JP | 2000-200840 | 7/2000 |

OTHER PUBLICATIONS

Notification of Reasons for Rejection issued by the Japanese Patent Office on Aug. 19, 2008, for Japanese Patent Application No. 2004-089477, and English-language translation thereof.

* cited by examiner

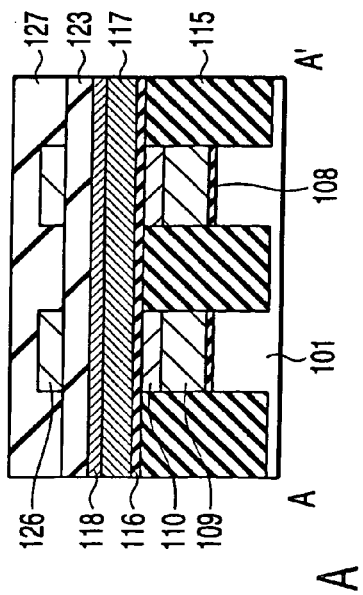
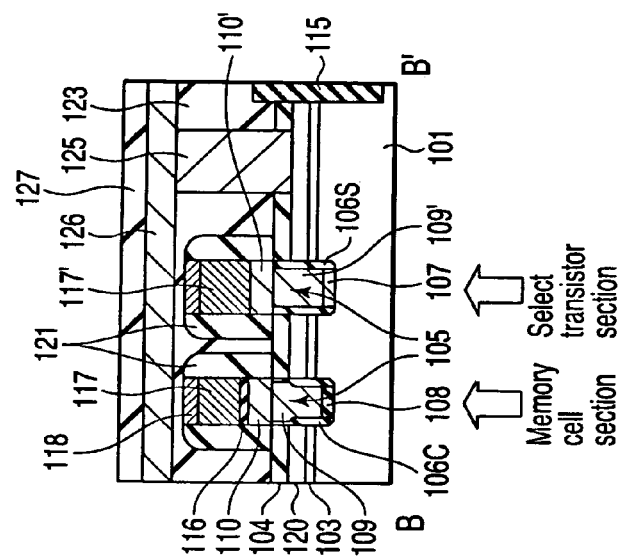
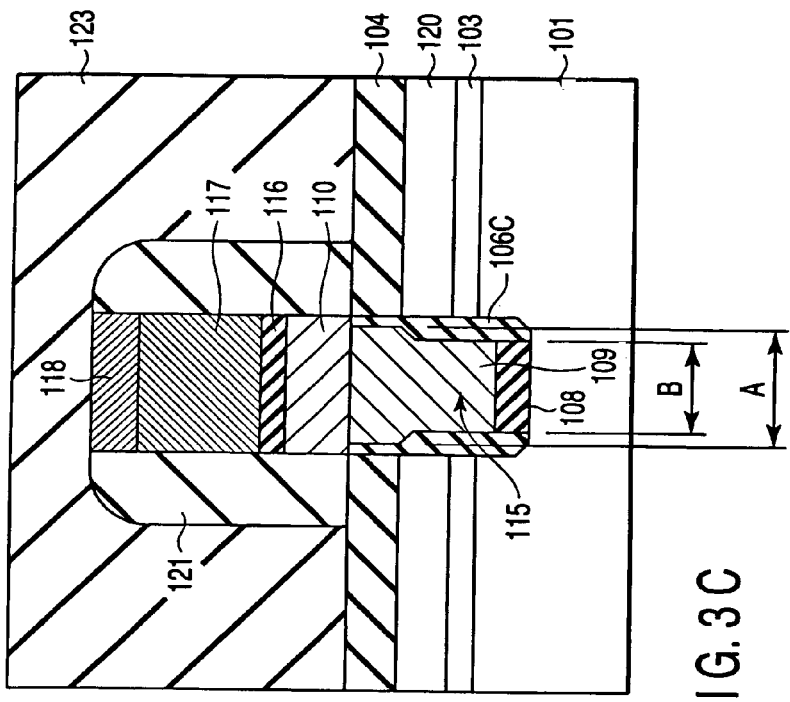
FIG.3A
FIG.3B
FIG.3C

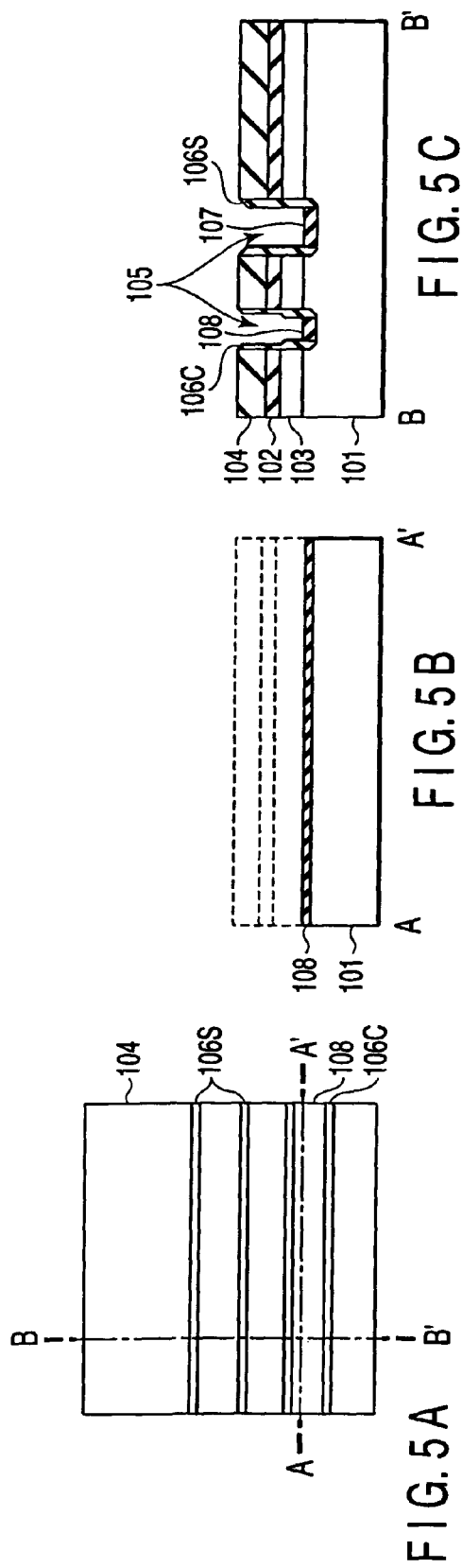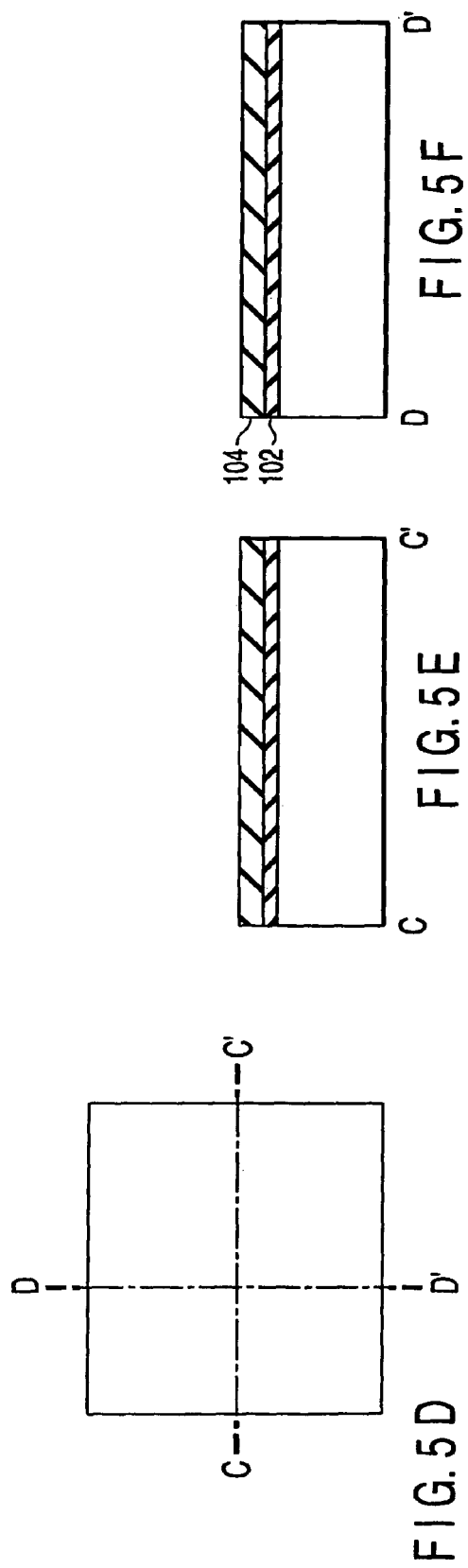

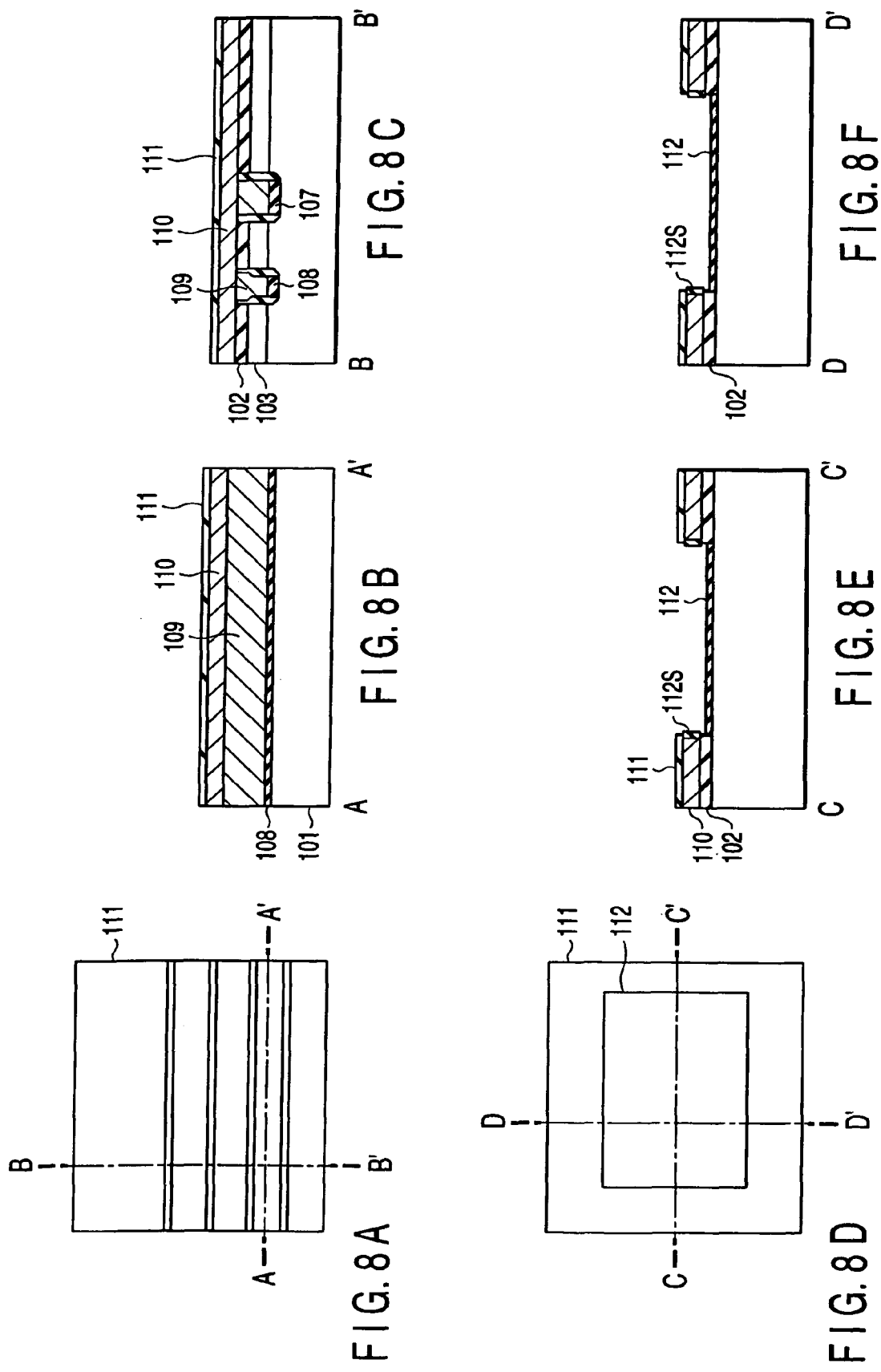

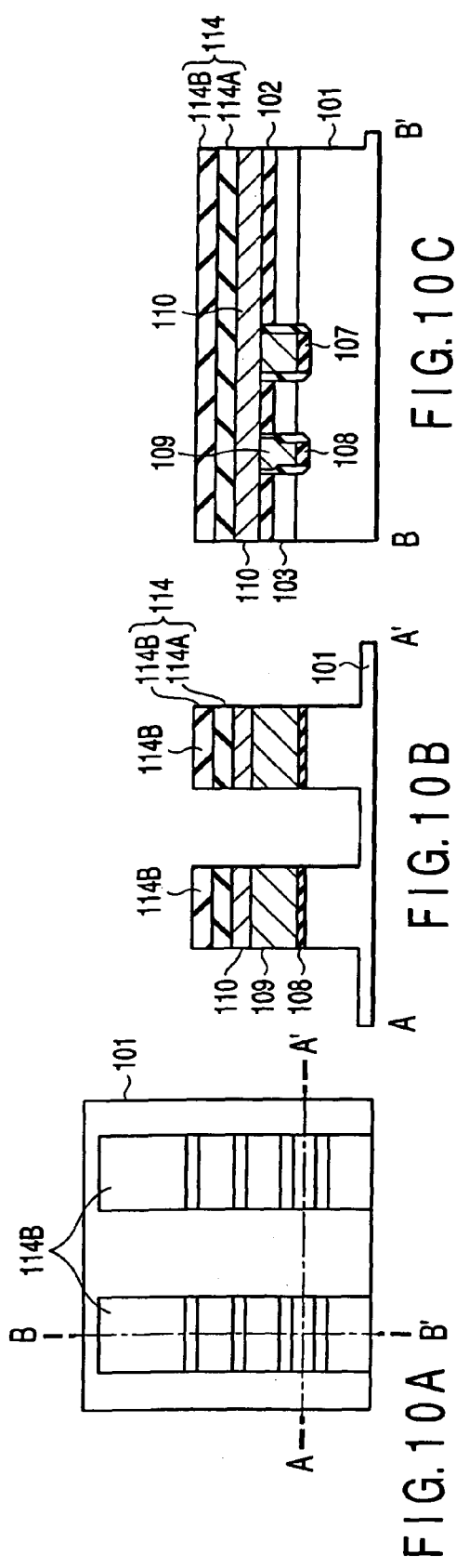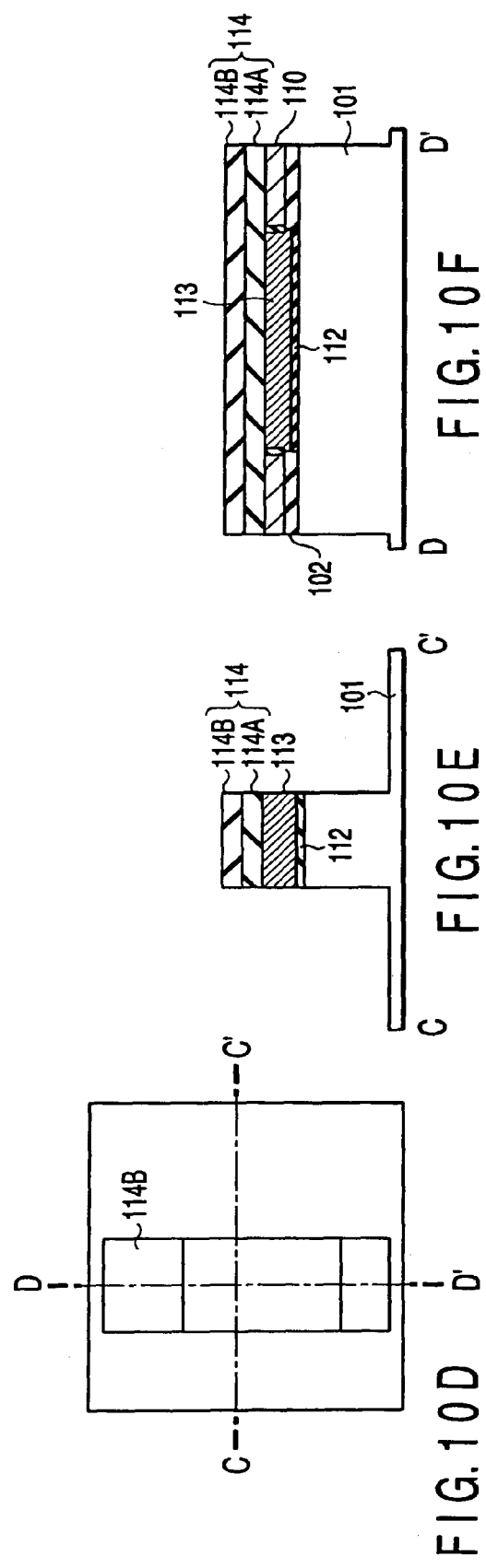

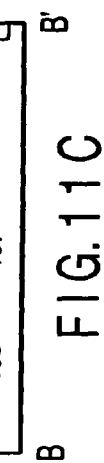
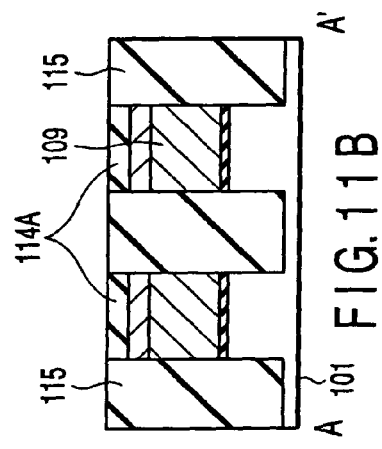
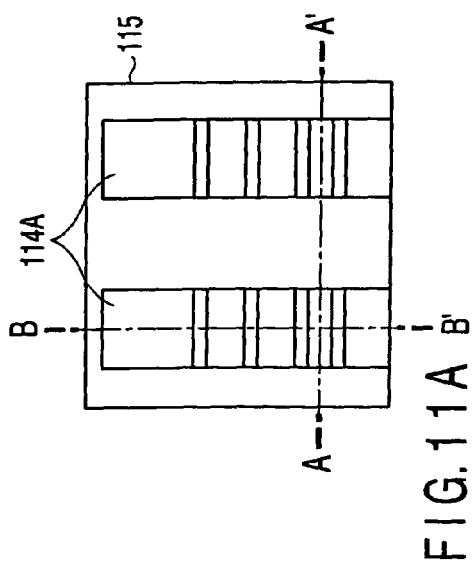
FIG.11A
FIG.11B
FIG.11C
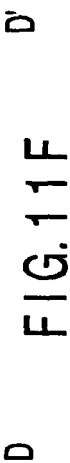
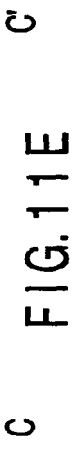
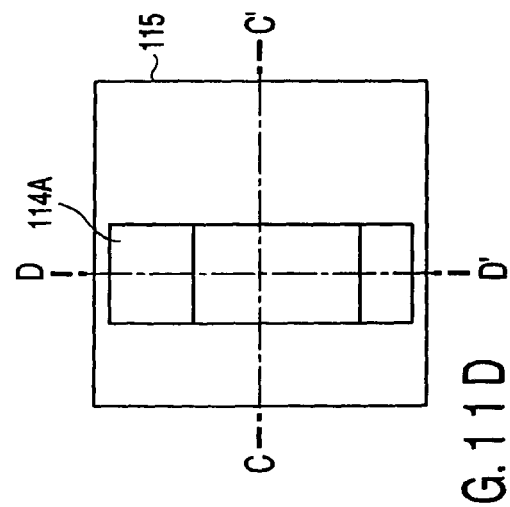
FIG.11D
FIG.11E
FIG.11F

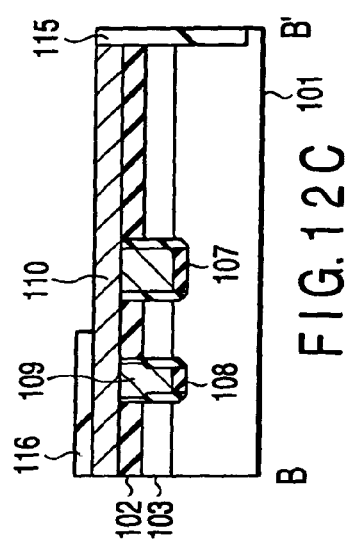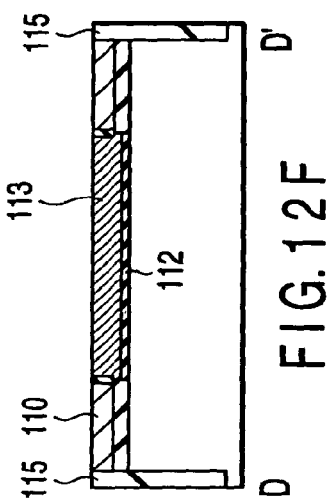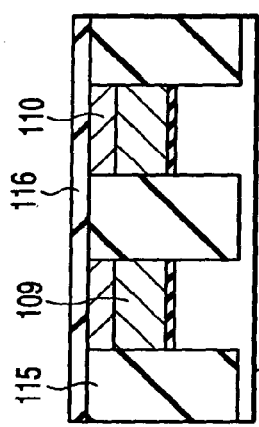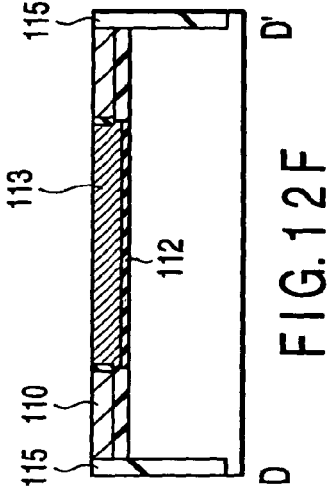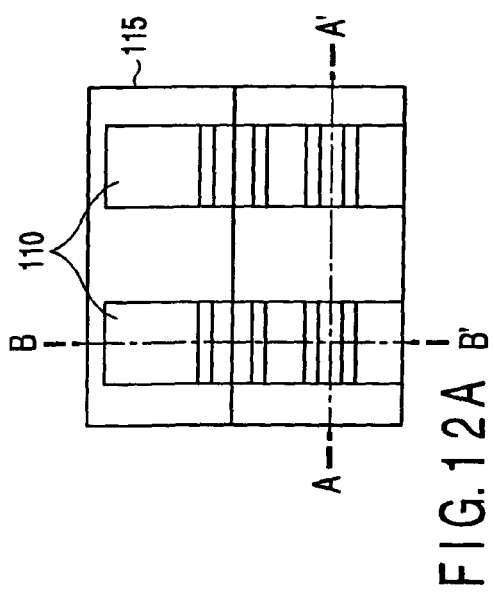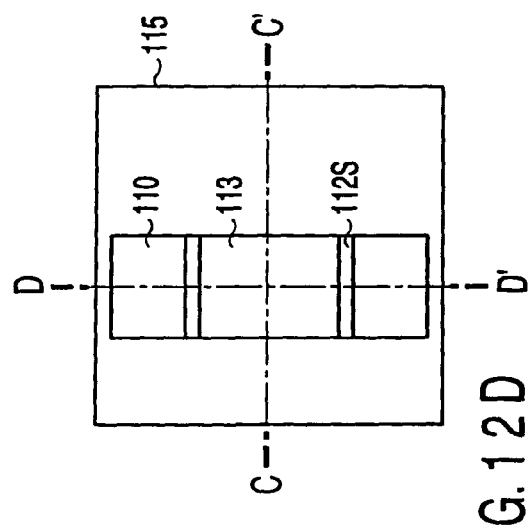

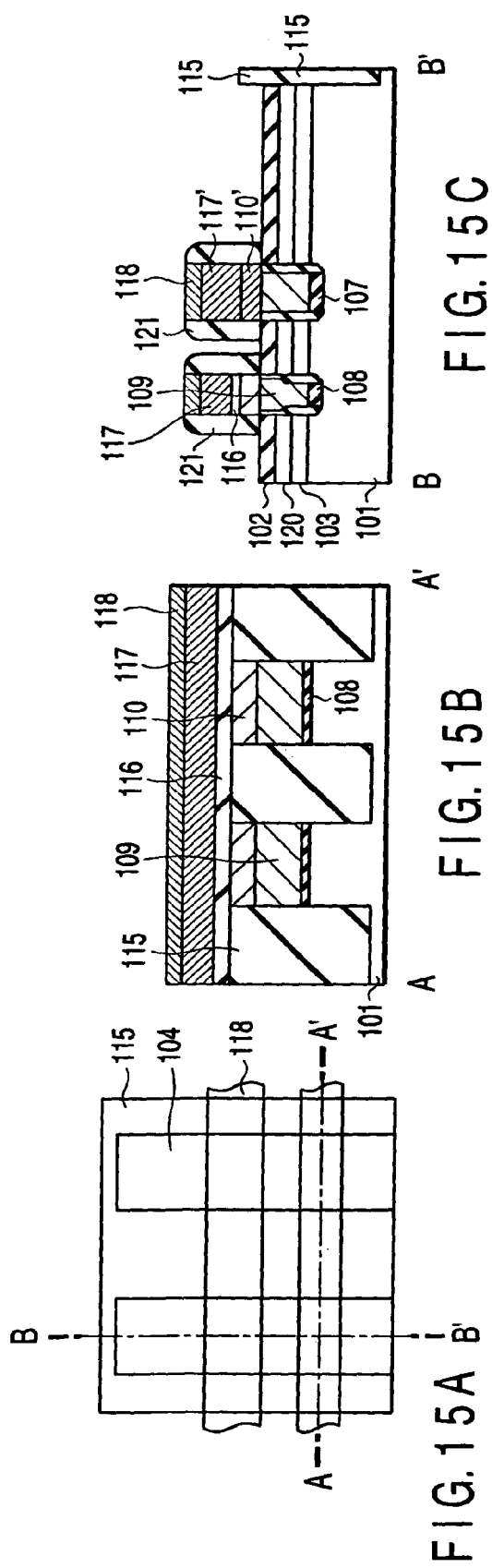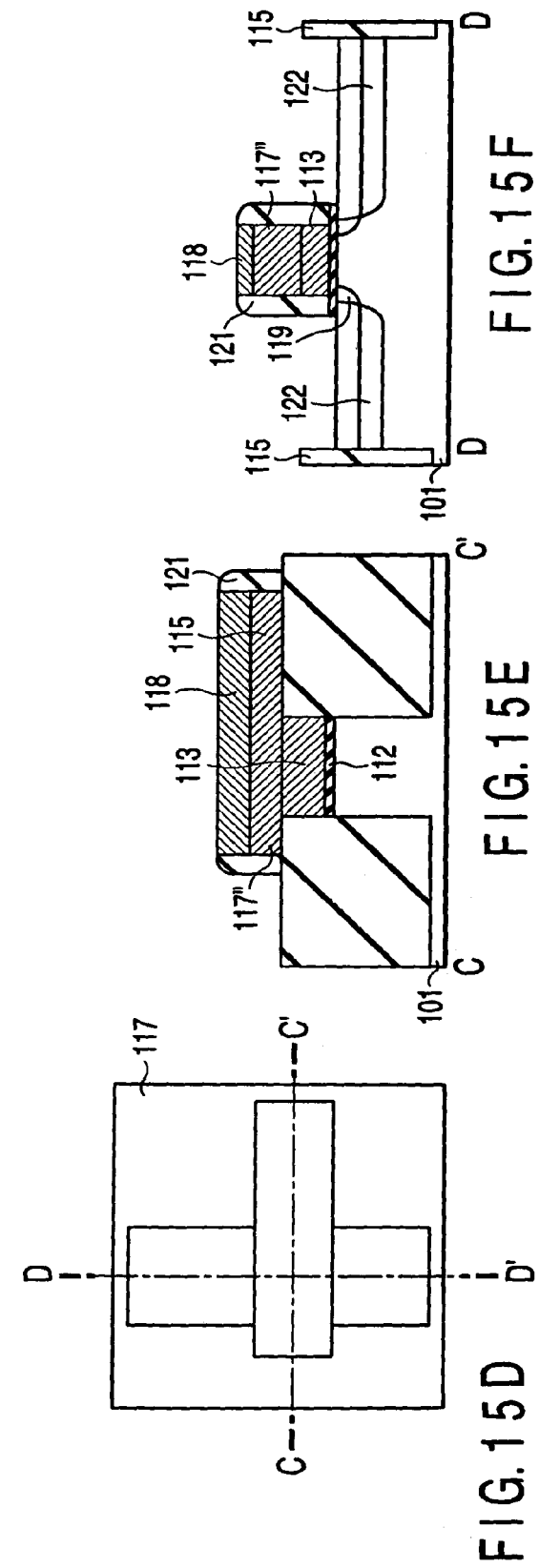

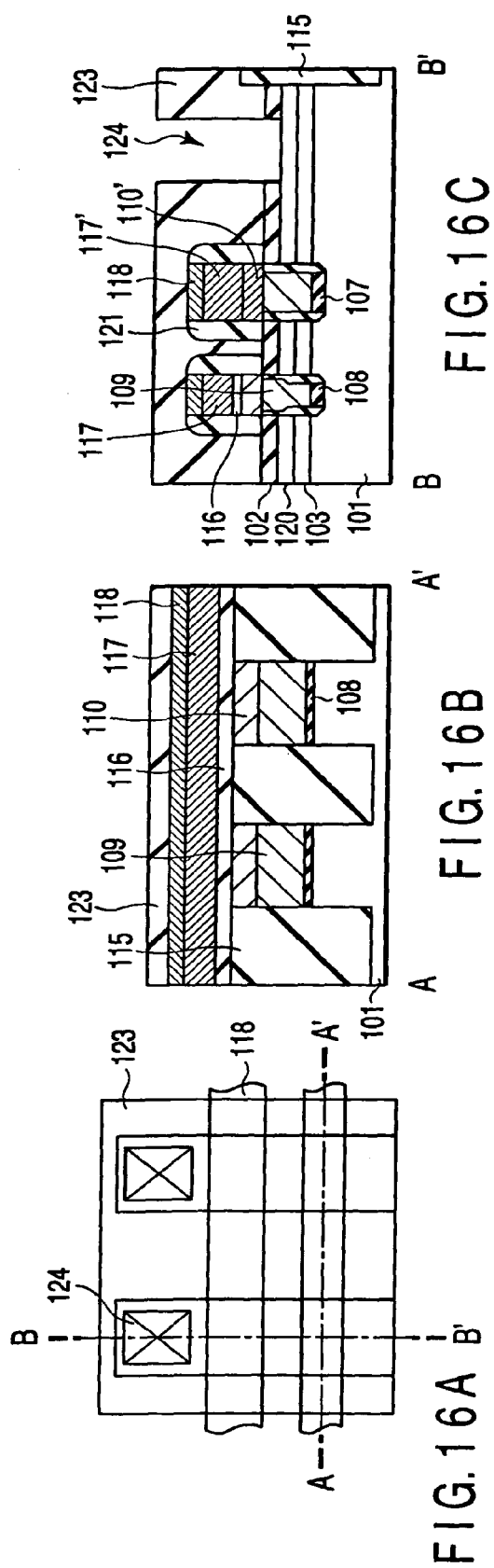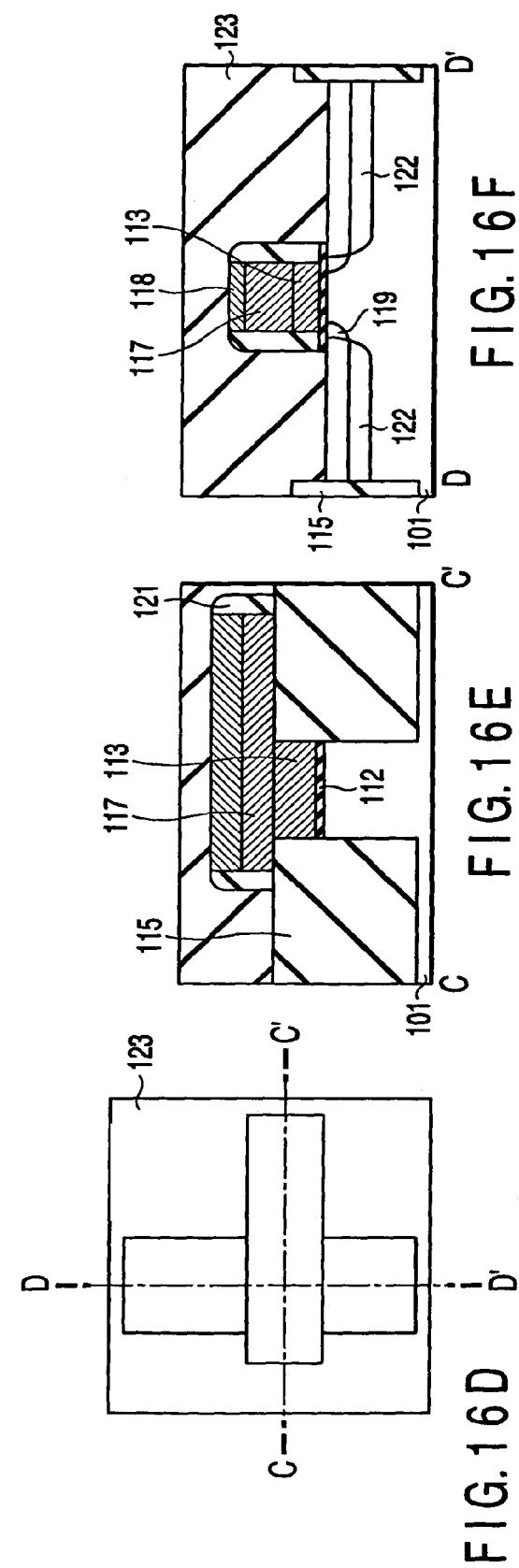

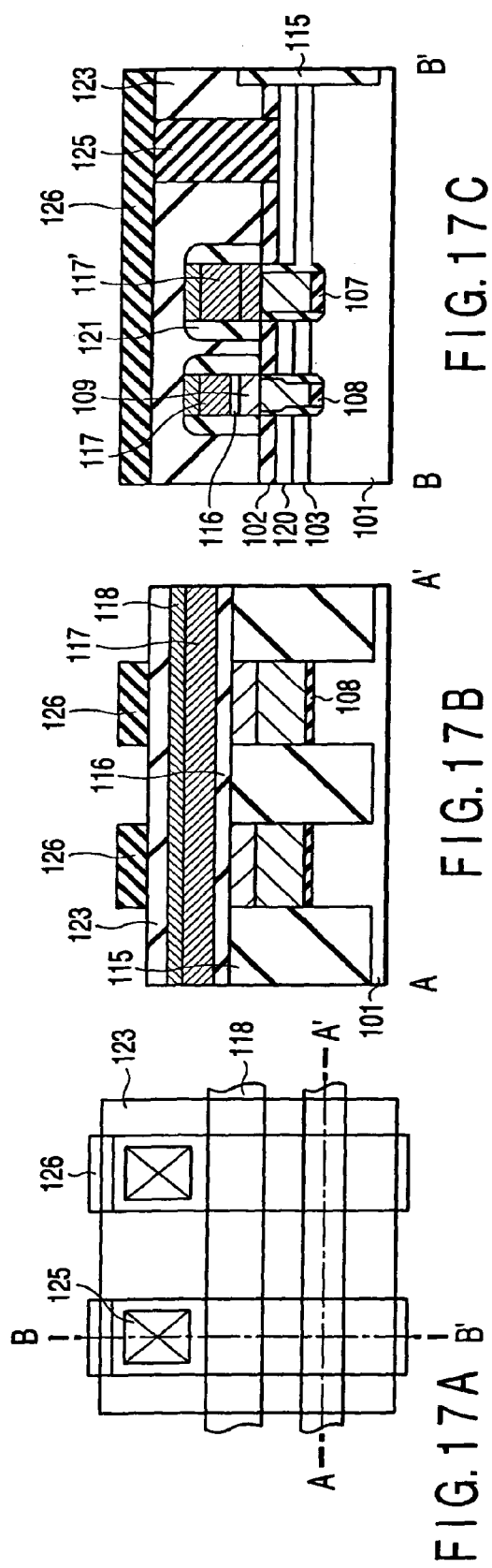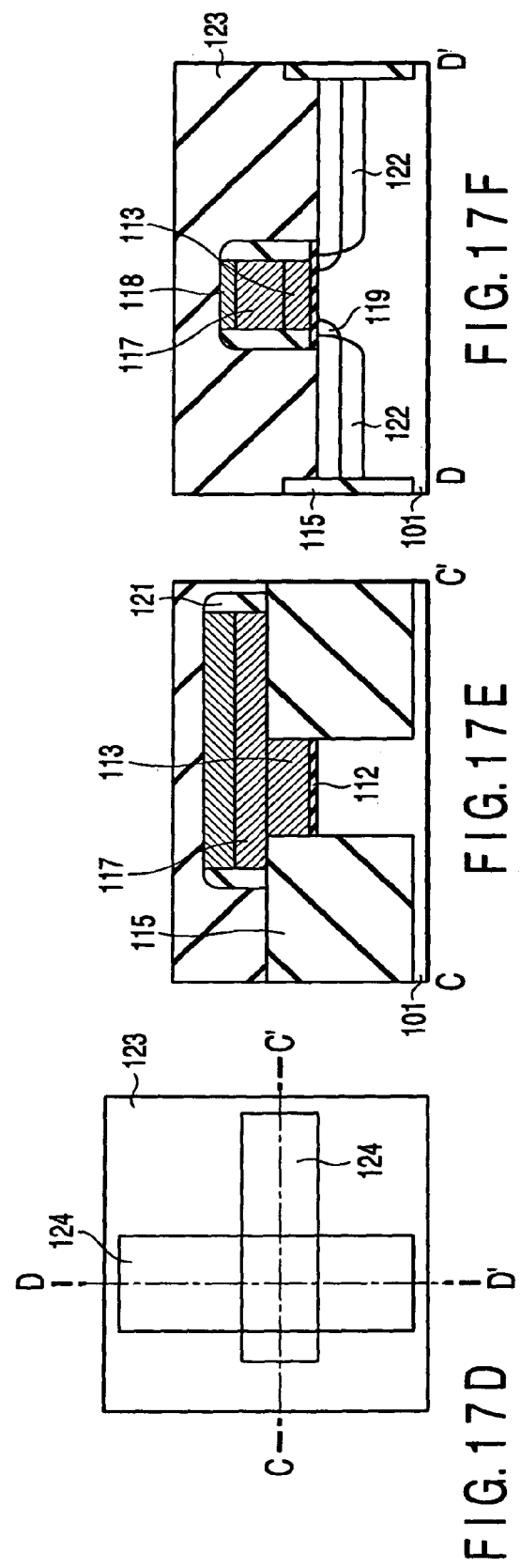

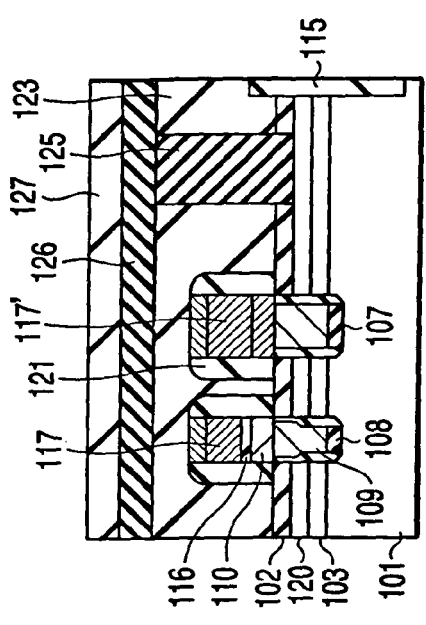
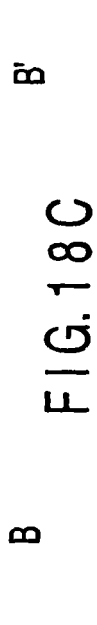
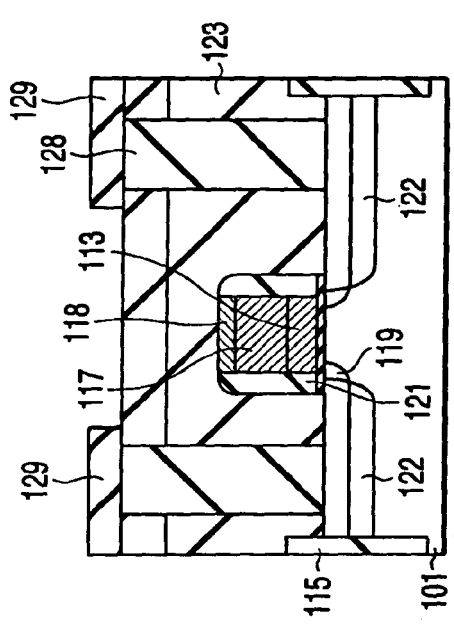
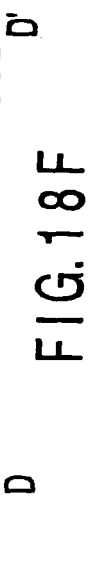
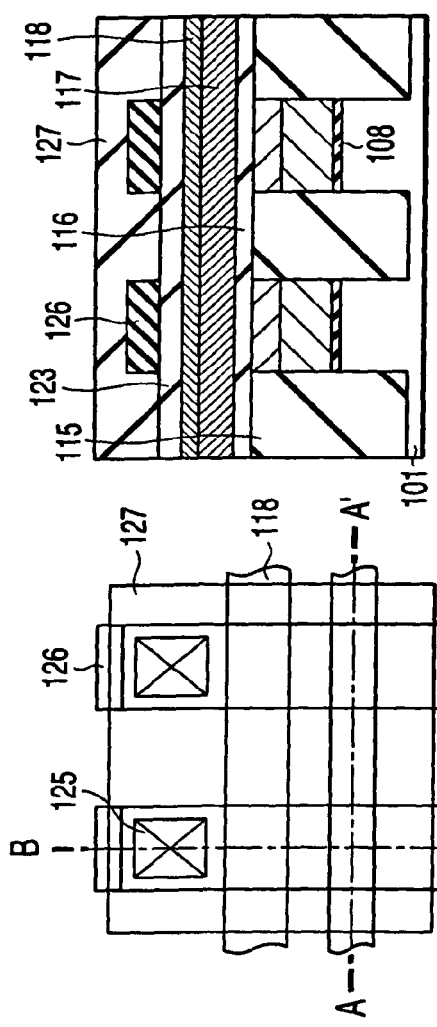
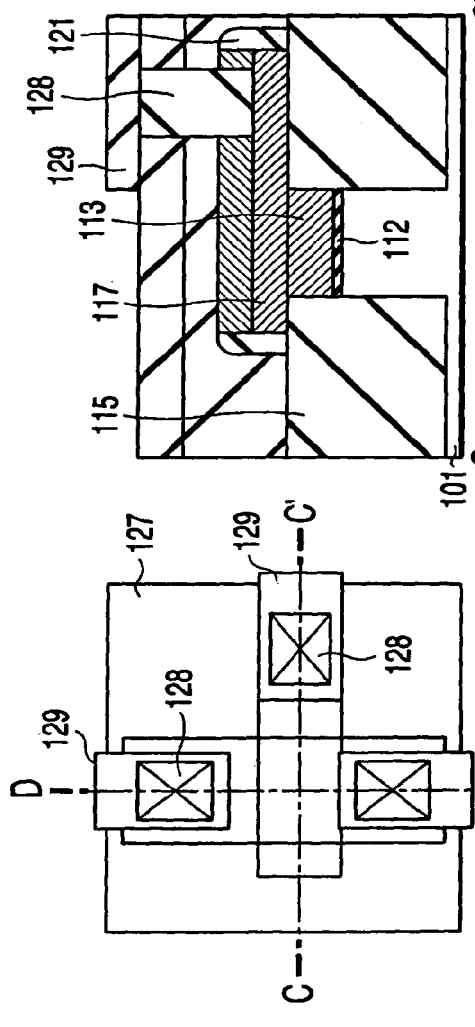

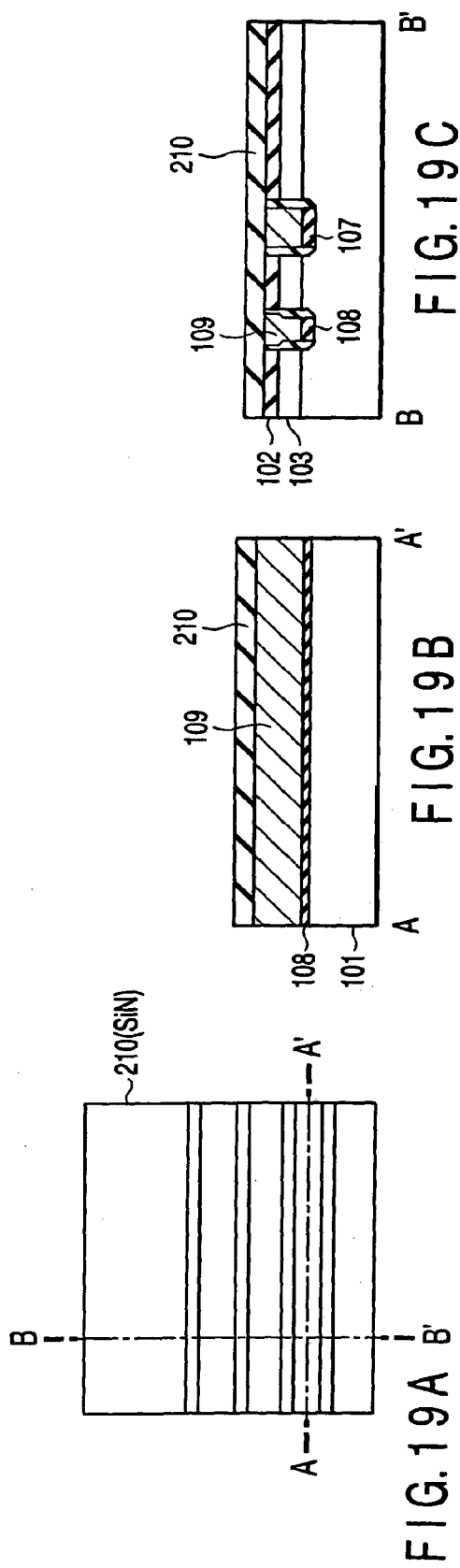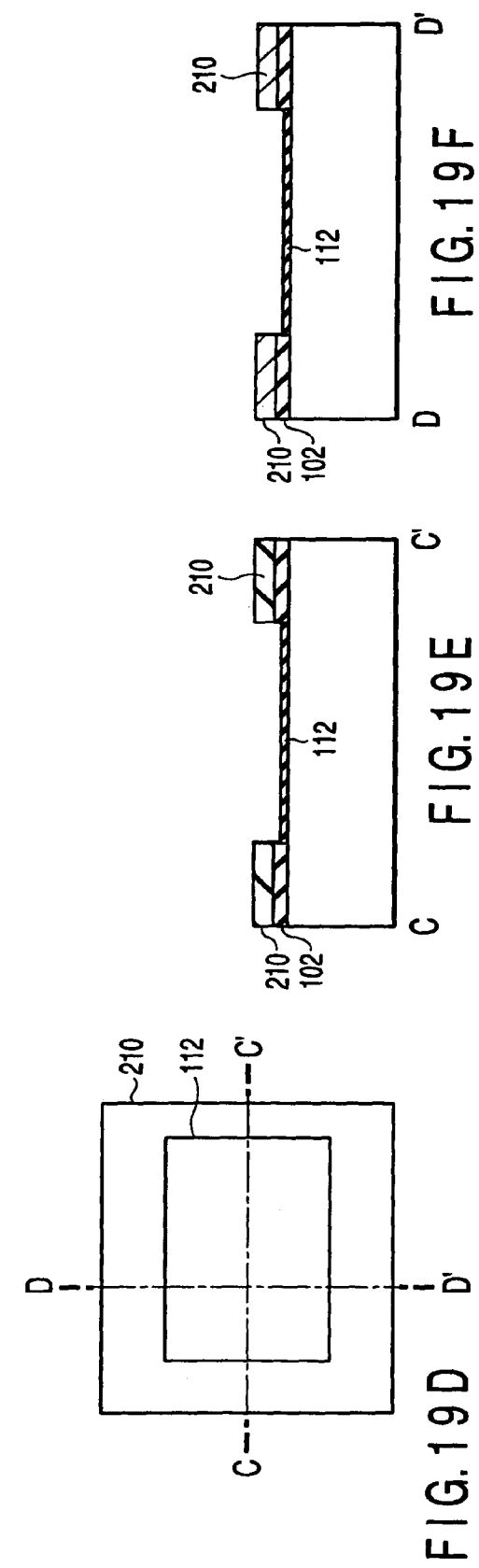

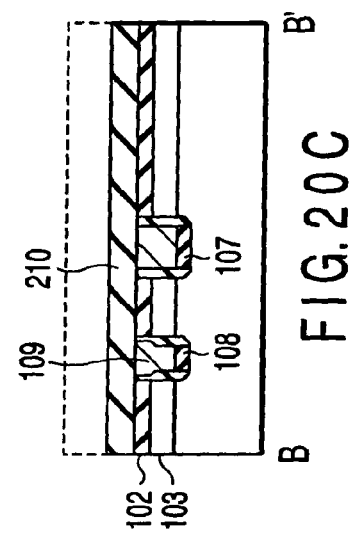
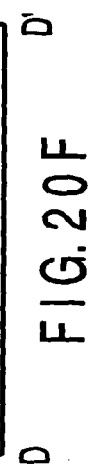
FIG.20B
FIG.20C
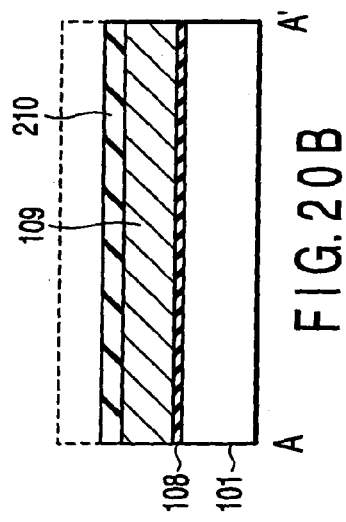
FIG.20E
FIG.20F
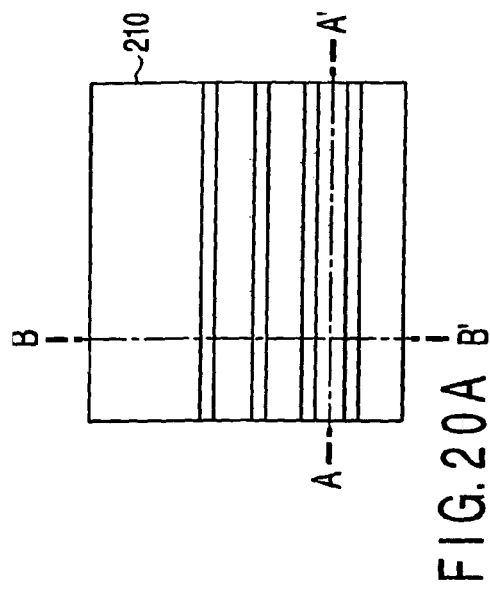
FIG.20A
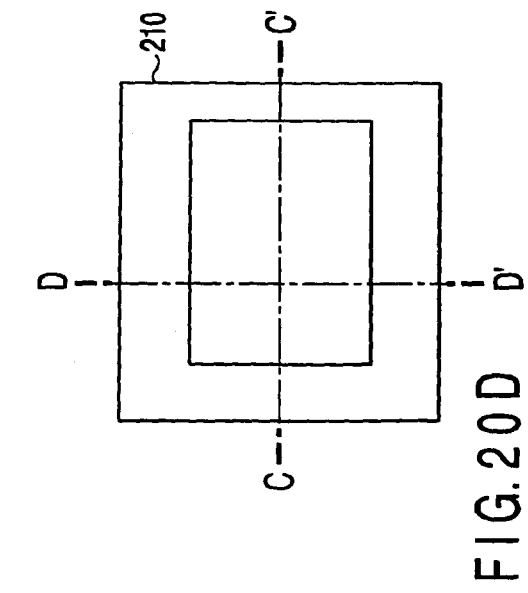
FIG.20D

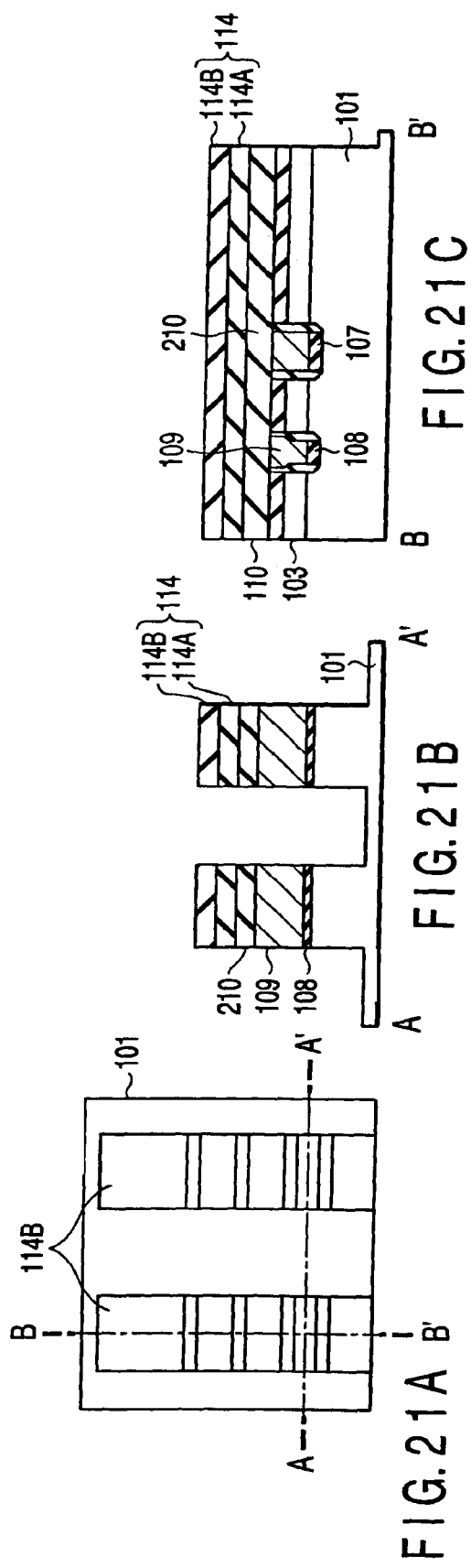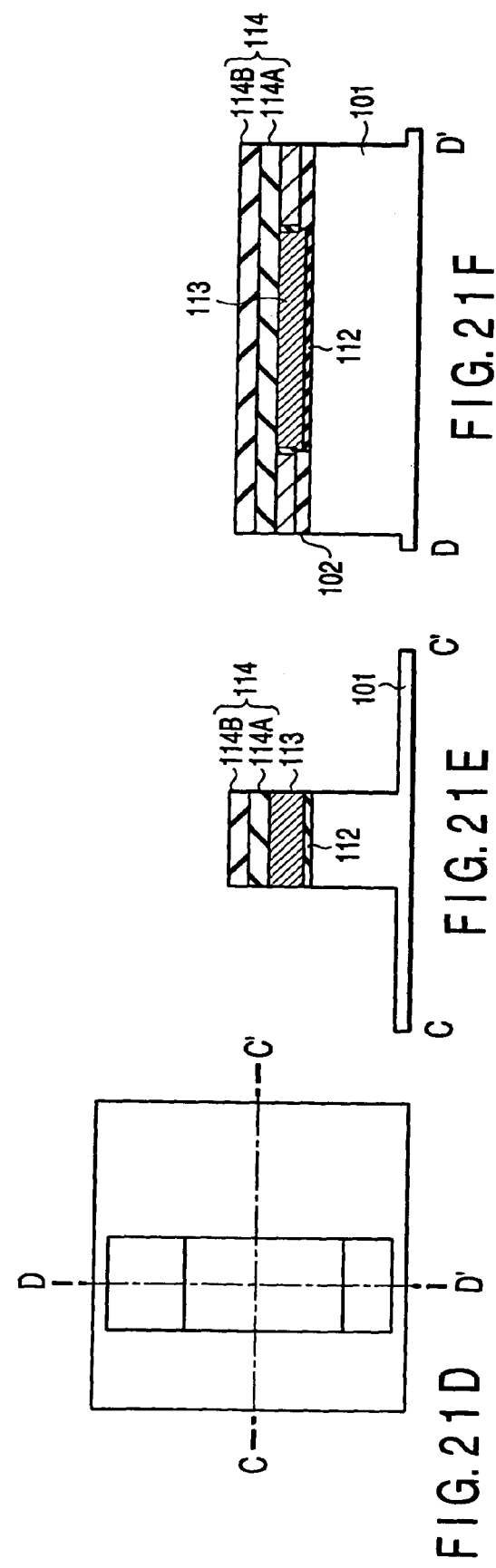

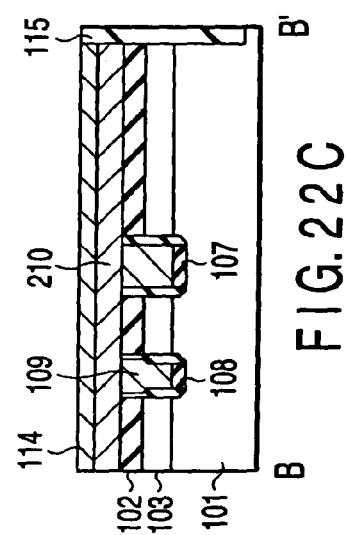
FIG. 22C
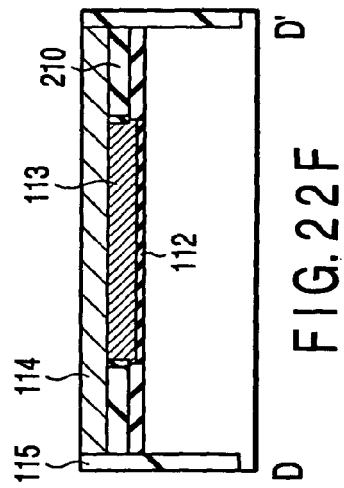
FIG. 22F
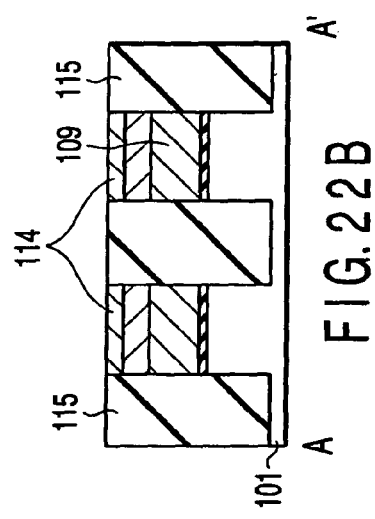
FIG. 22B
FIG. 22E
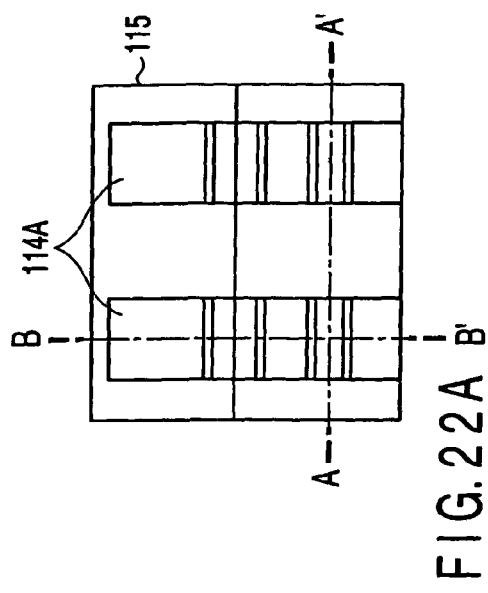
FIG. 22A
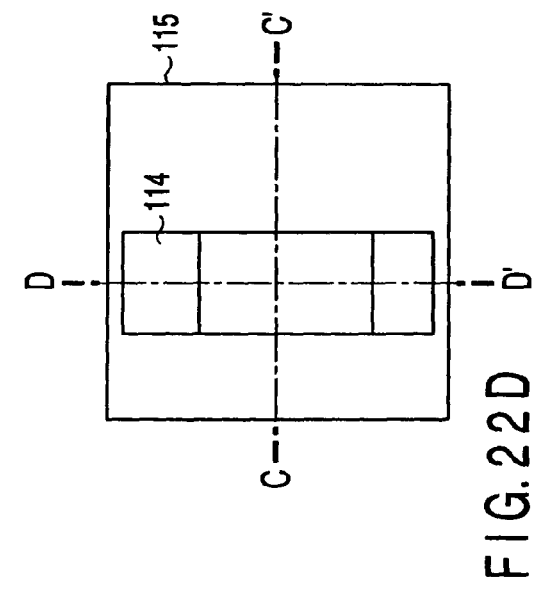
FIG. 22D

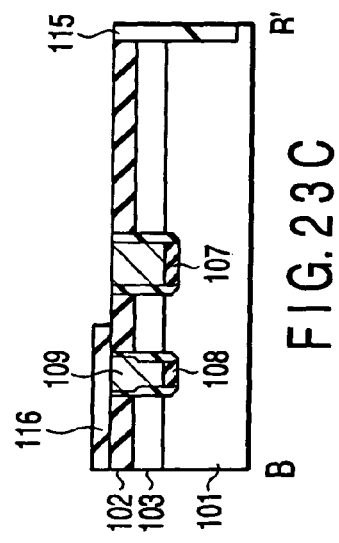
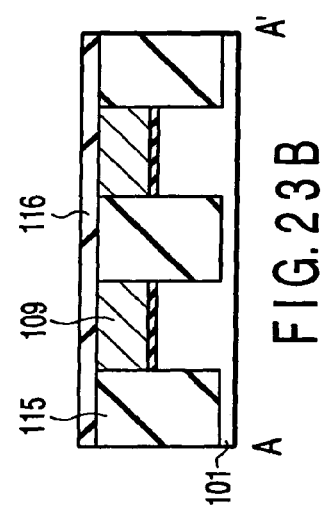
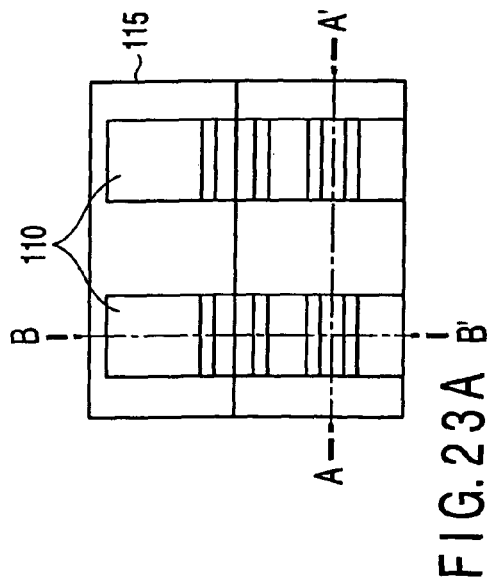
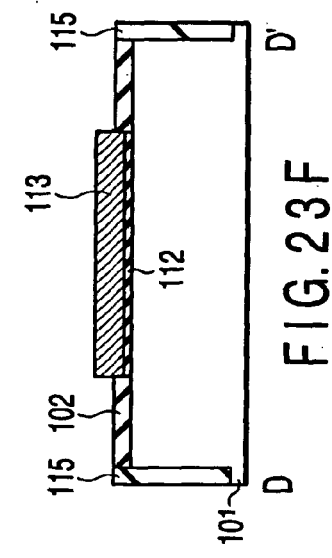
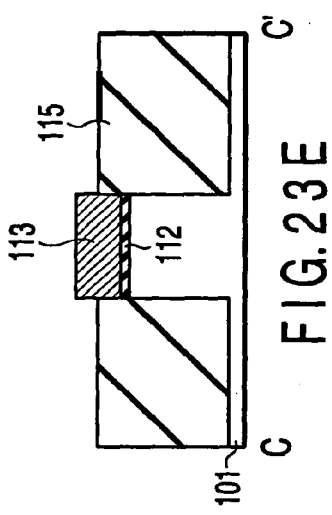
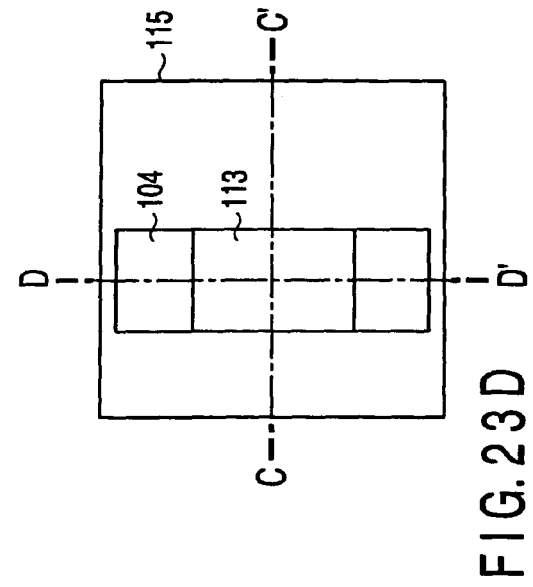

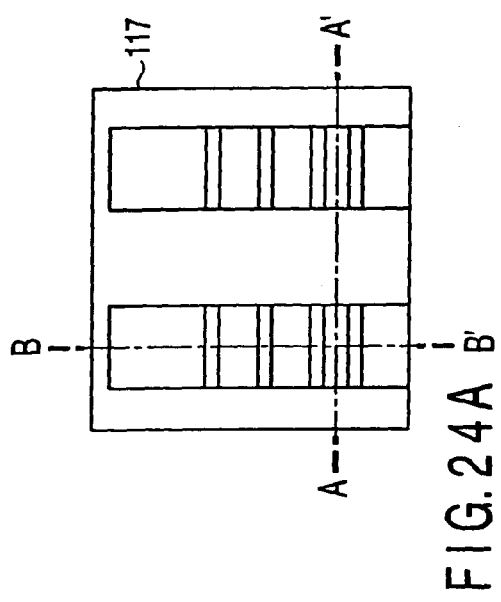
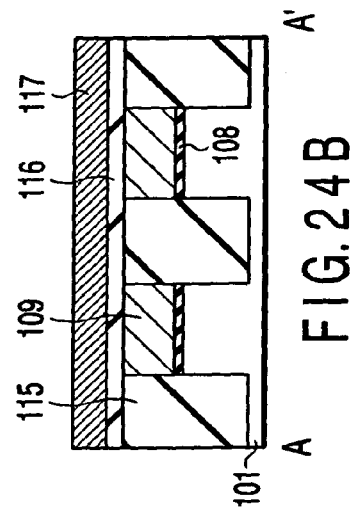
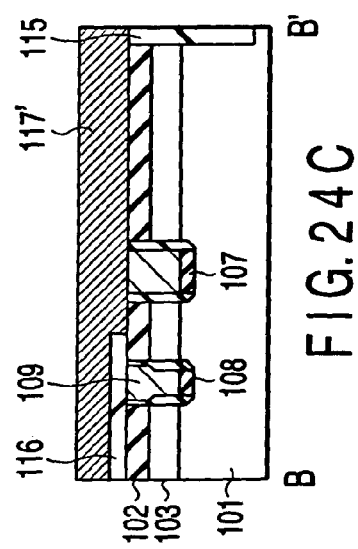
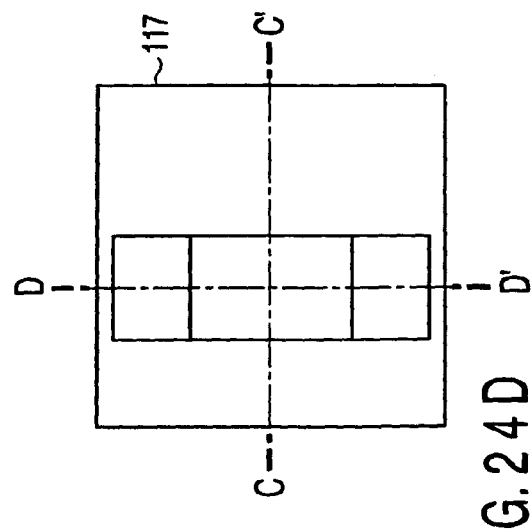
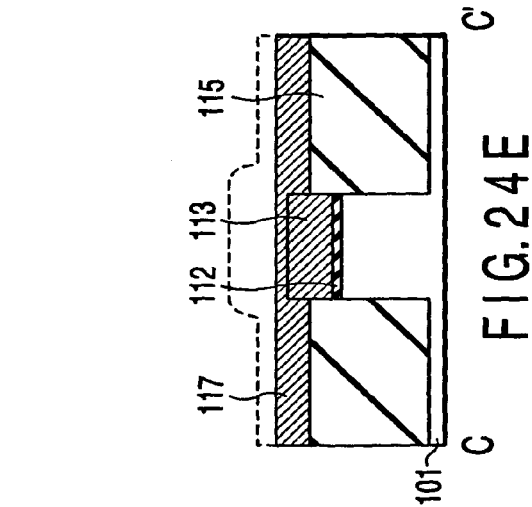
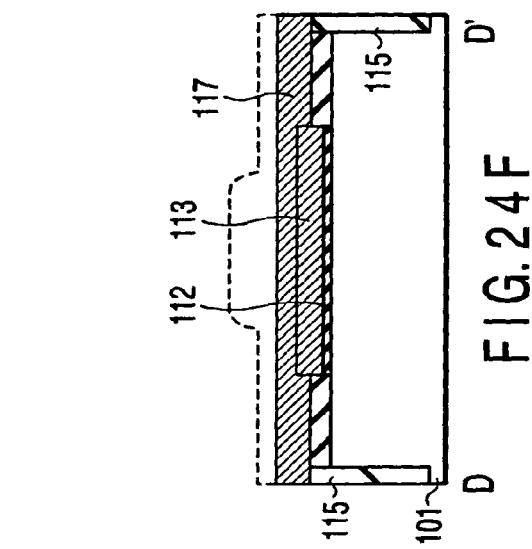

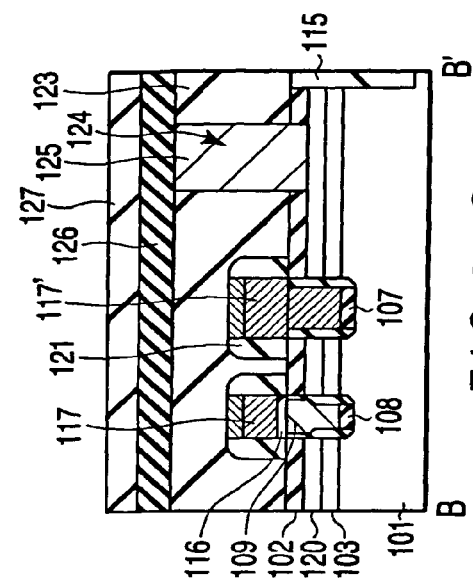
FIG.25A
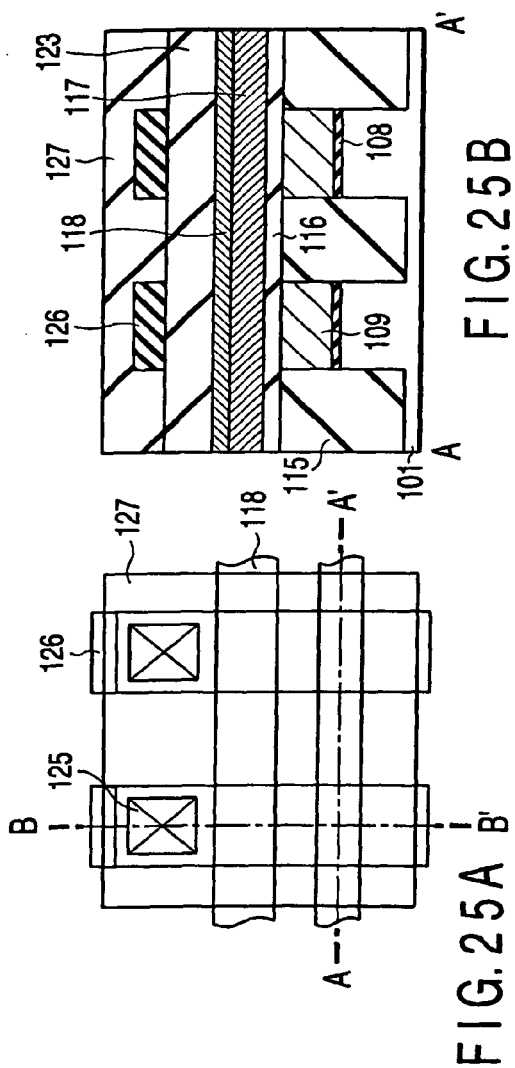
FIG.25B
FIG.25C
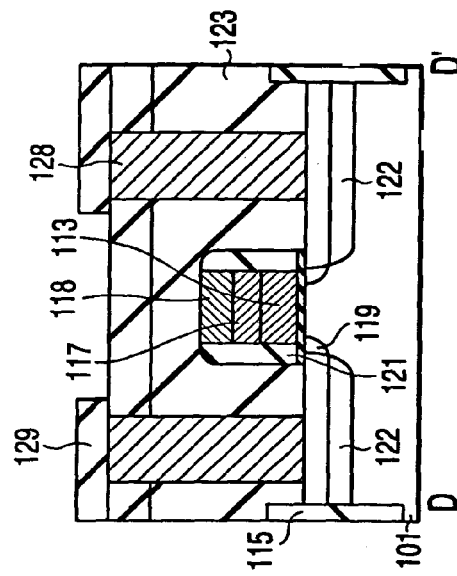
FIG.25D
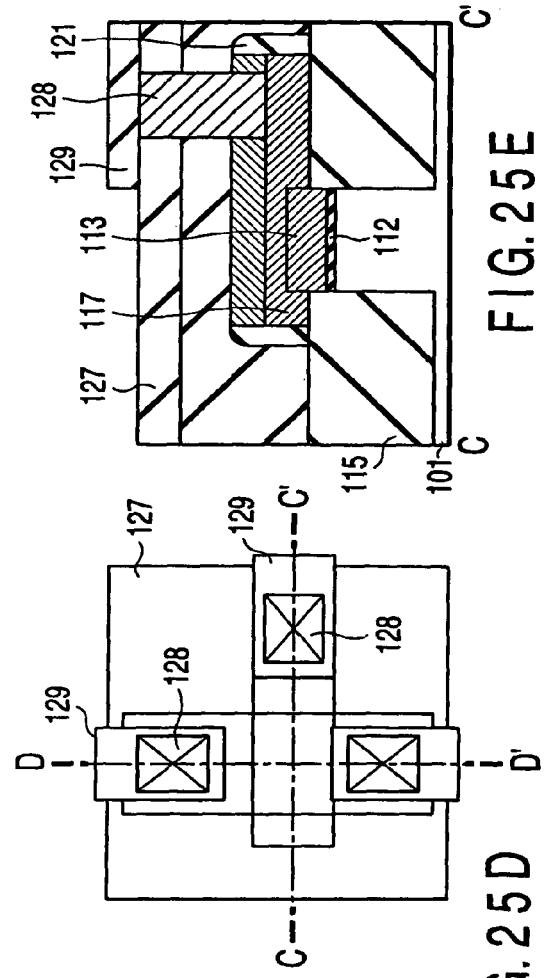
FIG.25E
FIG.25F

METHOD OF MANUFACTURING A SEMICONDUCTOR DEVICE

This is a divisional of application Ser. No. 11/085,197, filed Mar. 22, 2005 now U.S. Pat. No. 7,180,121, which is incorporated herein by reference.

CROSS-REFERENCE TO RELATED APPLICATIONS

This application is based upon and claims the benefit of priority from prior Japanese Patent Application No. 2004-089477, filed Mar. 25, 2004, the entire contents of which are incorporated herein by reference.

BACKGROUND OF THE INVENTION

1. Field of the Invention

The present invention relates to a semiconductor device comprising an electrically rewritable semiconductor memory device and the method of manufacturing the same.

2. Description of the Related Art

A nonvolatile semiconductor memory is one of the semiconductor memory devices. In recent years, the nonvolatile semiconductor devices are in increasing demand as data storage devices. As the typical electrically rewritable nonvolatile memories using floating-gate (FG) electrodes, NOR-type flash memory and NAND-type flash memory are known.

In order to increase the storage capacity of these flash memories, the dimensions of devices have been scaled down. However, shrinking the dimensions of devices have caused various problems, such as the increased aspect ratio of device structure, the effect on interference between adjacent FG electrodes, and the effect of variations in process on the injection of electrons into FG electrodes.

Since the NAND-type flash memory is advantageous to shrinking of the dimensions of devices, their storage capacity has been progressively increased. However, increasing the storage capacity has made problems of the short-channel effect (SCE) of transistors, the interaction (Yupin effect) due to coupling capacitance between adjacent FG electrodes, the reduced cell current by the miniaturization, and the difficulty in ensuring a sufficient coupling ratio between the control gate (CG) electrode-to-FG electrode capacitance (C2) and the FG electrode-to-substrate capacitance (C1). The coupling ratio is represented by $C2/(C1+C2)$. Therefore, attempts are being made to contrive new memory cell structures.

FIG. 28 to FIG. 30 are cross sectional views showing a conventional memory cell of the NAND type flash memory. FIG. 28 is cross sectional view in the direction of the bit line, FIG. 29 is a cross sectional view in the direction of the word line, and FIG. 30 shows an enlarged view of the region surrounded by a dot-and-slash line in FIG. 28. In these drawings, a reference numeral 310 denotes a silicon substrate, a reference numeral 311 denotes a gate insulating film, a reference numeral 312 denotes a tunnel insulating film, a reference numeral 313 denotes a FG electrode, a reference numeral 314 denotes a buried type isolation insulating film, a reference numeral 315 denotes an interpoly insulating film, a reference numeral 316 denotes a CG electrode, a reference numeral 317 denotes a source/drain diffusion layer, a reference numeral 318 denotes a spacer, a reference numeral 319 denotes a source/drain diffusion layer, a reference numeral 320 denotes an interlayer insulating film, a reference numeral 321 denotes a plug, and a reference numeral 322 denotes a bit line.

In the conventional memory cell structures, the coupling capacitance (C2) between FG and CG electrodes 313, 316 is made to increase by exposing the side of the FG electrode 313. However, the conventional memory cell structure gives rise to a problem as pointed out bellow.

As the dimensions of devices shrink, the FG electrode 313 becomes narrower in width and smaller in top surface area. Accordingly, it becomes difficult to ensure a sufficient coupling ratio.

There are variations in the process for exposing the side of the FG electrode 313. Also, in generally a nonuniformity is brought about in the width of the active area (AA). The variations cause the coupling capacitance C1 between the FG electrode 313 and the silicon substrate 310 and the coupling capacitance C2 between the FG electrode 313 and the CG electrode 316 to vary. The variations of the coupling capacitances C1 and C2 result in a reduction in the yield of products.

With the conventional memory cell structure, in order to increase the cell current, it is required to increase the height of and the area of the side of the FG electrode 313. Increasing the height of the FG electrode 313 leads to an increasing of the aspect ratio in the FG process. In terms of process, therefore, it is difficult to realize a high FG electrode 313. Therefore, with the above method, it is difficult to increase the cell current.

In order to reduce the variations in the coupling capacitances C1 and C2 and to increase the cell current, a device structure has been proposed in which an FG electrode is formed on the side surface of a trench formed in the surface of a silicon substrate with a tunnel insulating film interposed therebetween (Jpn. Pat. Appln. KOKAI Publication No. 5-291586). With this device structure, however, limitations are encountered in increasing the coupling ratio. Moreover, since there are corners in the channel region, the writing (injecting electrons into the FG electrode) characteristics vary greatly according to their shape. Furthermore, in processing the CG and FG electrodes on the sidewall of the trench in the surface of the silicon substrate, there arises a problem in that the surface of the silicon substrate suffers etching.

BRIEF SUMMARY OF THE INVENTION

According to an aspect of the present invention, there is provided a semiconductor device comprising: a semiconductor device comprising: a substrate including a semiconductor and a trench, the trench being provided on a surface of the substrate; and an electrically rewritable semiconductor memory cell provided on the substrate, the semiconductor memory cell comprising: a charge storage layer including an upper surface and a lower surface, an area of the lower surface being smaller than an area of the upper surface, and at least a part of the charge storage layer being provided in the trench, a first insulating layer provided between the lower surface of the charge storage layer and a bottom surface of the trench, a second insulating layer provided between a side surface of the trench and a side surface of the charge storage layer and between the side surface of the trench and a side surface of the first insulating layer, a third insulating layer provided on the charge storage layer, and a control gate electrode provided on the third insulating layer.

According to an aspect of the present invention, there is provided a method of manufacturing a semiconductor device comprising: a substrate including a semiconductor and an electrically rewritable semiconductor memory provided on the substrate, the manufacturing method comprising: forming a trench on the surface of the substrate; forming first and second insulating films respectively on bottom and side surfaces of the trench; forming a charge storage layer, at least a part of the charge storage layer being provided in the trench, and an area of the lower surface of the charge storage layer being smaller than an area of the upper surface of the charge storage layer; forming a third insulating film on the charge storage layer; and forming a control gate electrode on the third insulating layer.

BRIEF DESCRIPTION OF THE SEVERAL VIEWS OF THE DRAWING

FIGS. 3A to 3C are a cross sectional view along the line A-A' shown in FIG. 1A and an enlarged cross sectional view in a part of FIG. 2.

FIGS. 5A to 5F are plan views and cross sectional views for describing the manufacturing method of the NAND flash memory according to the first embodiment of the present invention subsequent to the FIGS. 4A to 4F;

FIGS. 8A to 8F are plan views and cross sectional views for describing the manufacturing method of the NAND flash memory according to the first embodiment of the present invention subsequent to the FIGS. 7A to 7F;

FIGS. 10A to 10F are plan views and cross sectional views for describing the manufacturing method of the NAND flash memory according to the first embodiment of the present invention subsequent to the FIGS. 9A to 9F;

FIGS. 11A to 11F are plan views and cross sectional views for describing the manufacturing method of the NAND flash memory according to the first embodiment of the present invention subsequent to the FIGS. 10A to 10F;

FIGS. 12A to 12F are plan views and cross sectional views for describing the manufacturing method of the NAND flash memory according to the first embodiment of the present invention subsequent to the FIGS. 11A to 11F;

FIGS. 15A to 15F are plan views and cross sectional views for describing the manufacturing method of the NAND flash memory according to the first embodiment of the present invention subsequent to the FIGS. 14A to 14F;

FIGS. 16A to 16F are plan views and cross sectional views for describing the manufacturing method of the NAND flash memory according to the first embodiment of the present invention subsequent to the FIGS. 15A to 15F;

FIGS. 17A to 17F are plan views and cross sectional views for describing the manufacturing method of the NAND flash memory according to the first embodiment of the present invention subsequent to the FIGS. 16A to 16F;

FIGS. 18A to 18F are plan views and cross sectional views for describing the manufacturing method of the NAND flash memory according to the first embodiment of the present invention subsequent to the FIGS. 17A to 17F;

FIGS. 19A to 19F are plan views and cross sectional views for describing the manufacturing method of the NAND flash memory according to the second embodiment of the present invention;

FIGS. 20A to 20F are plan views and cross sectional views for describing the manufacturing method of the NAND flash memory according to the second embodiment of the present invention subsequent to the FIGS. 19A to 19F;

FIGS. 21A to 21F are plan views and cross sectional views for describing the manufacturing method of the NAND flash memory according to the second embodiment of the present invention subsequent to the FIGS. 20A to 20F;

FIGS. 22A to 22F are plan views and cross sectional views for describing the manufacturing method of the NAND flash memory according to the second embodiment of the present invention subsequent to the FIGS. 21A to 21F;

FIGS. 23A to 23F are plan views and cross sectional views for describing the manufacturing method of the NAND flash memory according to the second embodiment of the present invention subsequent to the FIGS. 22A to 22F;

FIGS. 24A to 24F are plan views and cross sectional views for describing the manufacturing method of the NAND flash memory according to the second embodiment of the present invention subsequent to the FIGS. 23A to 23F;

FIGS. 25A to 25F are plan views and cross sectional views for describing the manufacturing method of the NAND flash memory according to the second embodiment of the present invention subsequent to the FIGS. 24A to 24F;

DETAILED DESCRIPTION OF THE INVENTION

An embodiment of the present invention will now be described with reference to the accompanying drawings.

First Embodiment

Figure 1A:
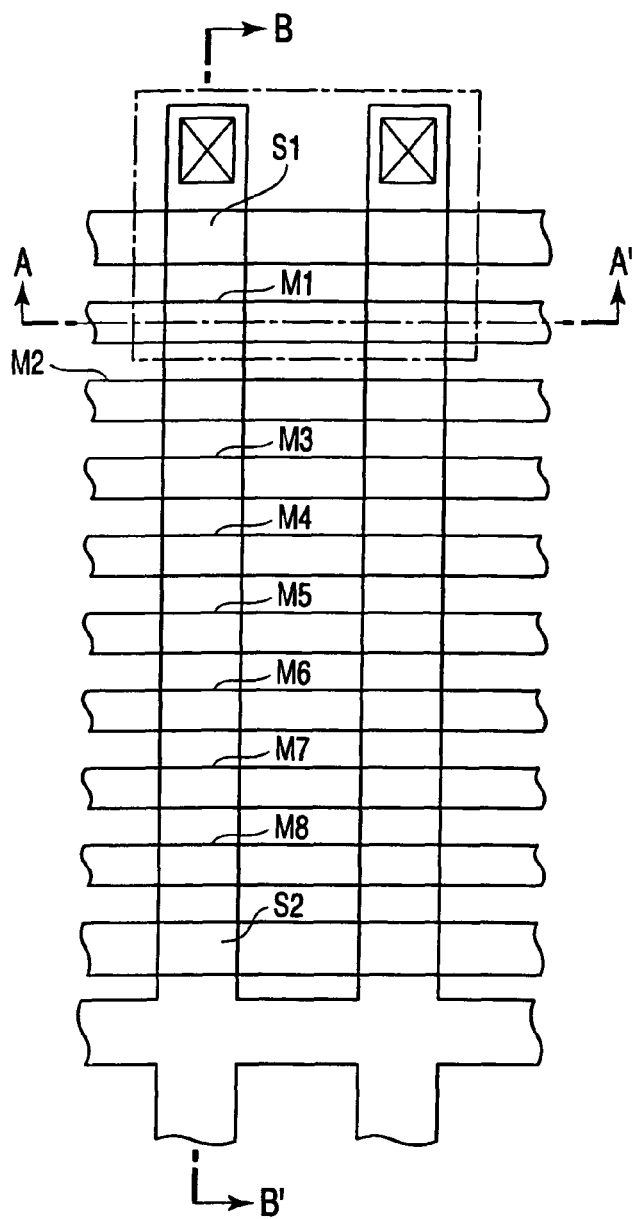
FIGS. 1A and 1B are a plan view and an equivalent circuit diagram, respectively, of a NAND type flash memory according to a first embodiment of the present invention.
Figure 1B:
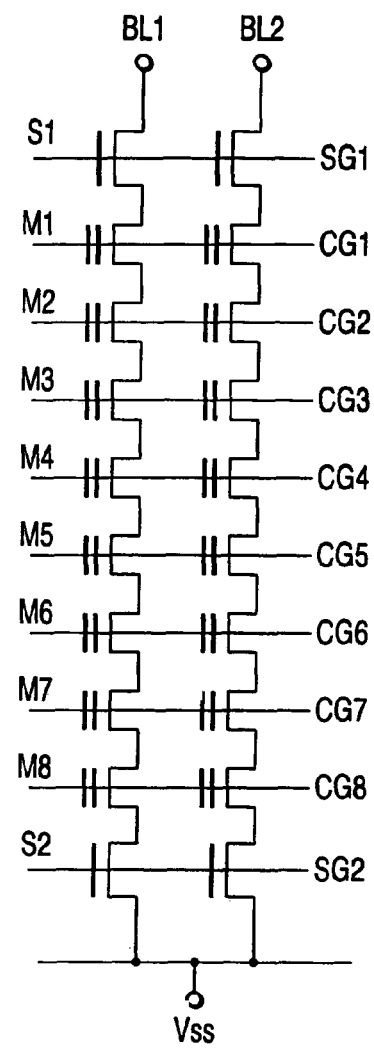

FIGS. 1A and 1B show a NAND flash memory according to the first embodiment of the present invention. FIG. 1A is a plan view of the memory cell of the NAND flash memory, and FIG. 1B is an equivalent circuit diagram of the memory cell shown in FIG. 1A.

In FIG. 1A and FIG. 1B, M1 to M8 denote nonvolatile memory cell sections, S1 and S2 denote select transistor sections, CG1 to CG8 denote floating gates, SG1 and SG2 denote select gates, BL1 and BL2 denote bit lines, and Vss denotes the power source voltage (ground).

Figure 2:
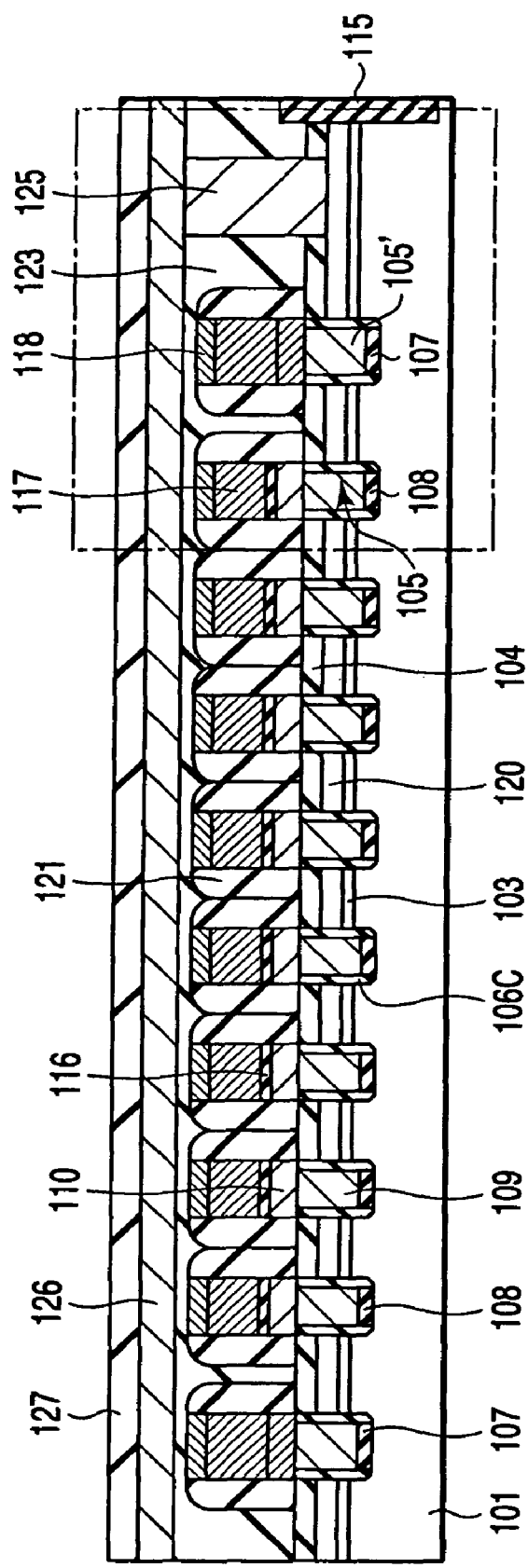
FIG. 2 is a cross sectional view along the line B-B' shown in FIG. 1A.

FIG. 2 is a cross sectional view along the line B-B' shown in FIG. 1A, FIG. 3A shows a part of the cross section along the line A-A' shown in FIG. 1A, FIG. 3B is a cross sectional view showing an enlarged view of a part of FIG. 2, and FIG. 3C is a cross sectional view showing an enlarged view of the memory cell section shown in FIG. 3B. Note that wiring layers up to the word lines and the bit lines are illustrated, but contacts, wiring layers higher than metal lines and the passivation layer are omitted from the drawings.

The reference numerals given in FIGS. 2, 3A, 3B and 3C denote the members given below:

101: P-type silicon substrate;
103: source/drain diffusion layers in the cell array section;
104: silicon nitride film;
105: trench (concave);
106C and 106S: silicon oxide films provided on the side surfaces of the trench 105;
107: gate insulating film of a select transistor;
108: tunnel insulating film;
109: floating gate electrode (first FG electrode) in a memory cell section formed inside the trench 105;
109': gate electrode (select gate electrode) of a select transistor formed inside the trench 105;
110: FG electrode (second FG electrode);
110': gate electrode (select gate electrode) of the select transistor section formed outside the trench 105;
115: insulating film (isolation insulating film) for filling an isolation trench (STI trench);
116: interpoly insulating film (high-k film) formed between the floating gate (FG) and the control gate (CG);
117: control gate (CG) electrode (word line);
117': select gate electrode;
118: mask layer (silicon nitride film or silicon oxide film);
120: source/drain diffusion layers for a cell array section, the diffusion layers having a high impurity concentration;
121: spacer;
123: interlayer insulating film;
125: buried layer (contact plug) extending to reach a bit line contact;
126: bit line;
127: interlayer insulating film;

The transistor in the memory cell section has a concave type transistor structure. As shown in FIG. 3B, the silicon oxide film 106C is provided on the side surface of the trench 105. The silicon oxide film 106C is thicker than the tunnel insulating film 108. Likewise, the silicon oxide film 106S is provided on the side surface of the trench 105 in the select transistor section.

In this manner, the width of the trench 105 is narrowed by the silicon oxide films 106C and 106S on the side surfaces of the trench 105. On that account, it is possible to make the width (i.e., the size in the longitudinal direction of the channel) of each of the FG electrode 109 and the gate electrode 109' smaller than the size determined by the limit of the lithography process. Accordingly, the capacitance C1 in the coupling ratio of (C2/(C1+C2)) can be reduced. In this way, the coupling ratio can be secured easily even if the miniaturization of the element is promoted.

The upper portion of the silicon oxide film 106C is thinner than the lower portion of the silicon oxide film 106C. Therefore, as shown in FIG. 3C, the width A in the upper portion of the trench 105 is larger than the width B in the lower portion of the trench 105. Accordingly, the area on the lower surface of the FG electrode 109 is made smaller than the area defined by the width of the trench 105. On the other hand, the area on the upper surface of the FG electrode 109 is larger than the area on the lower surface of the FG electrode 109. Further, the FG electrode 110 whose area is larger than the FG electrode 109 is provided on the FG electrode 109. Therefore, the area of the bottom surface of the FG electrode becomes sufficiently smaller than the area of top surface of the FG electrode. Accordingly, the capacitance C2 in the coupling ratio of (C2/(C1+C2)) is increased. Thereby, the coupling ratio can be secured easily even if the miniaturization of the element is promoted.

The upper corner portion of the trench 105 in the memory cell section is covered with the thick silicon nitride film 104 and with a thin portion in the upper portion of the silicon oxide film 106C. The upper corner portion of the trench 105 in the select transistor section is covered with the thick silicon nitride film 104 and with the silicon oxide film 106S.

Since the transistor in the memory cell section has a concave type transistor structure, it is possible for the transistor in the memory cell section to comprise the source/drain diffusion layers 120 each having a high impurity concentration.

Since a high-k film is used as the interpoly insulating film 116, a large capacitance C2 as desired between the floating gate (FG) and the control gate (CG) can be obtained on the upper surface (flat section) alone of the CG electrode 117. Since the side surface of the FG electrode is not used for obtaining a large capacitance C2 as described above, it is possible to decrease the thickness of the FG electrode. Thereby, the capacitive coupling between the adjacent FG electrodes can be lowered, then the operation of the memory cell is stabilized.

Figure 4C:
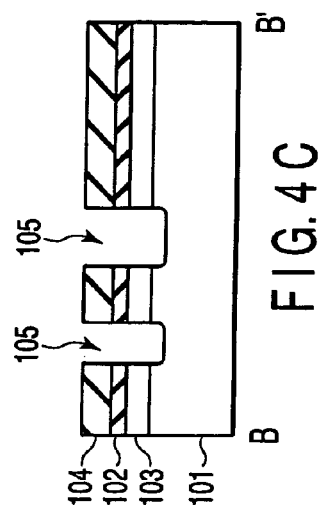
FIGS. 4A to 4F are plan views and cross sectional views for describing the manufacturing method of the NAND flash memory according to the first embodiment of the present invention.
Figure 4F:
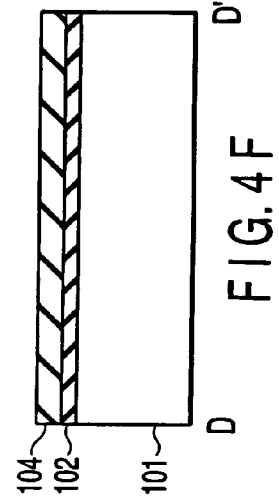
Figure 4B:
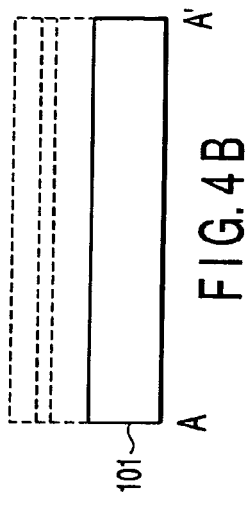
Figure 4E:
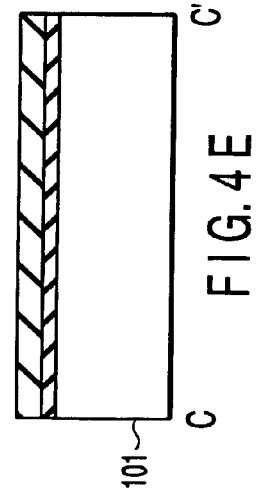
Figure 4A:
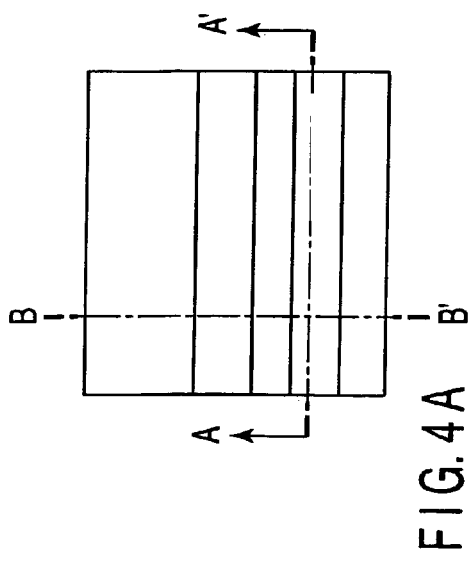
Figure 4D:
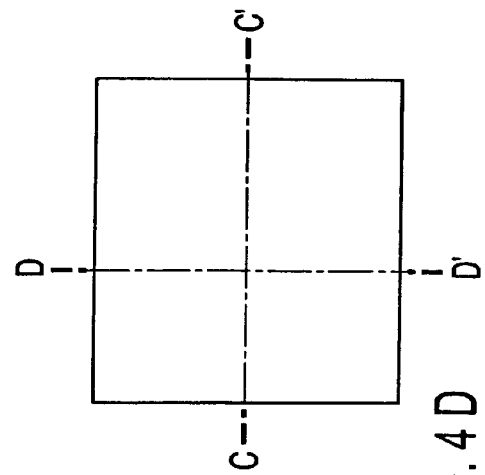
Figure 6C:
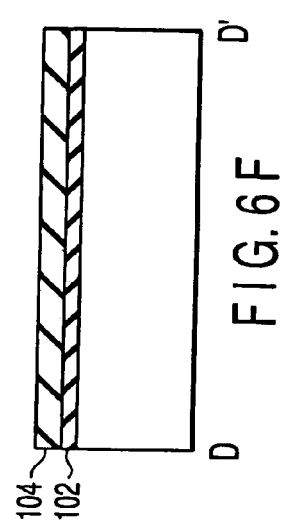
FIGS. 6A to 6F are plan views and cross sectional views for describing the manufacturing method of the NAND flash memory according to the first embodiment of the present invention subsequent to the FIGS. 5A to 5F.
Figure 6F:
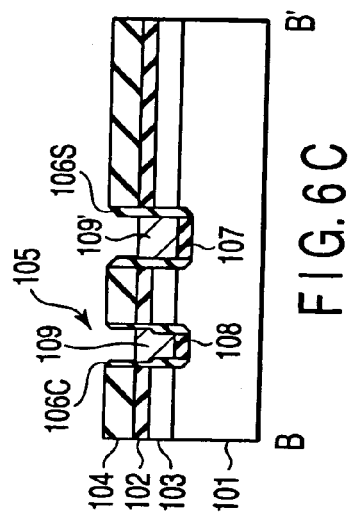
Figure 6B:
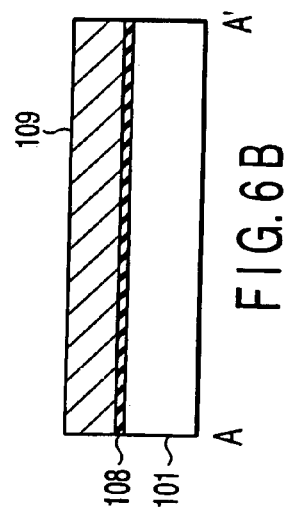
Figure 6E:
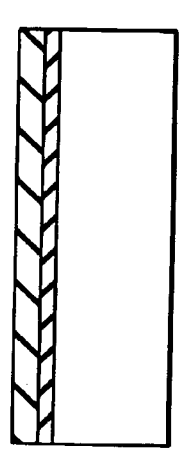
Figure 6A:
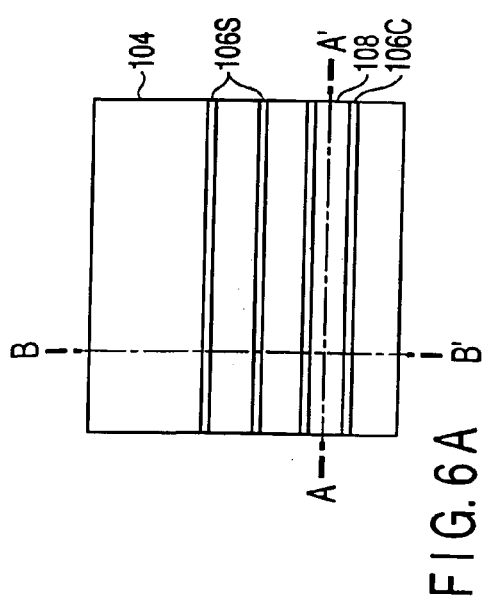
Figure 6D:
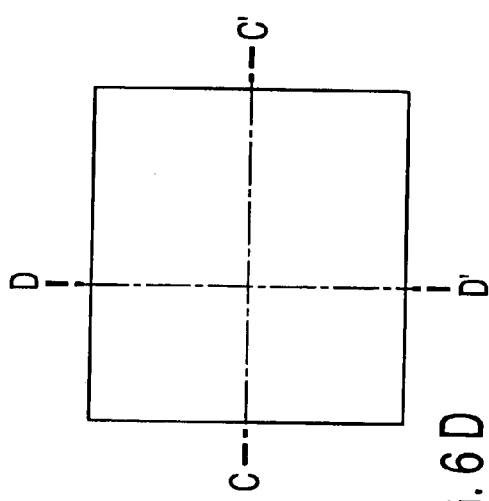
Figure 7C:
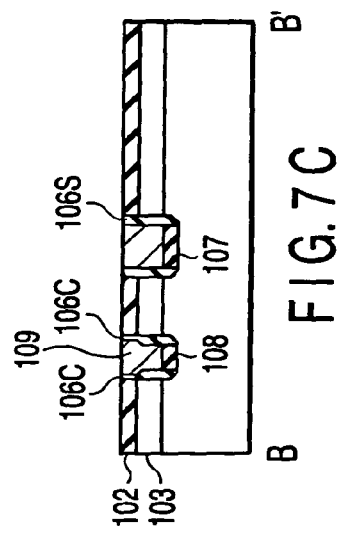
FIGS. 7A to 7F are plan views and cross sectional views for describing the manufacturing method of the NAND flash memory according to the first embodiment of the present invention subsequent to the FIGS. 6A to 6F.
Figure 7F:
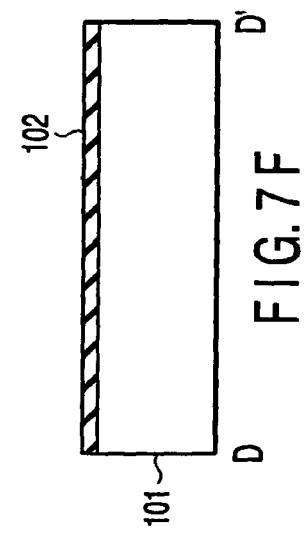
Figure 7B:
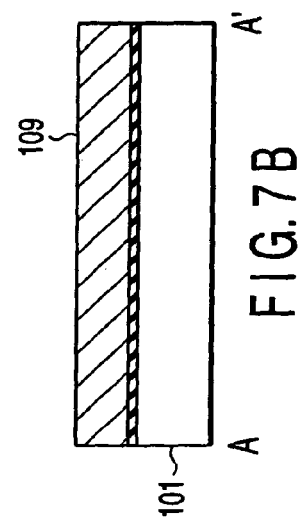
Figure 7E:
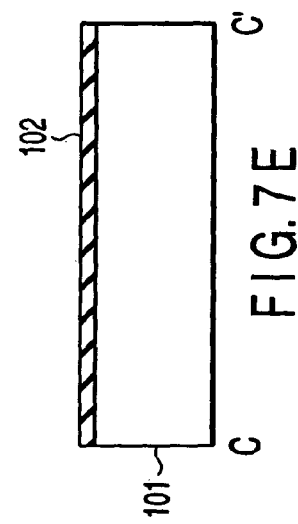
Figure 7A:
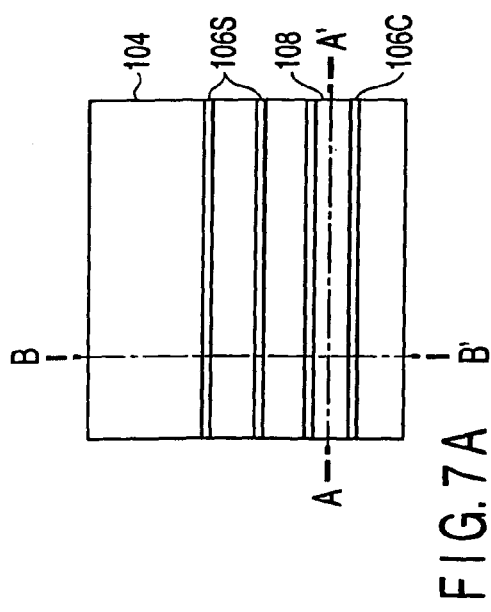
Figure 7D:
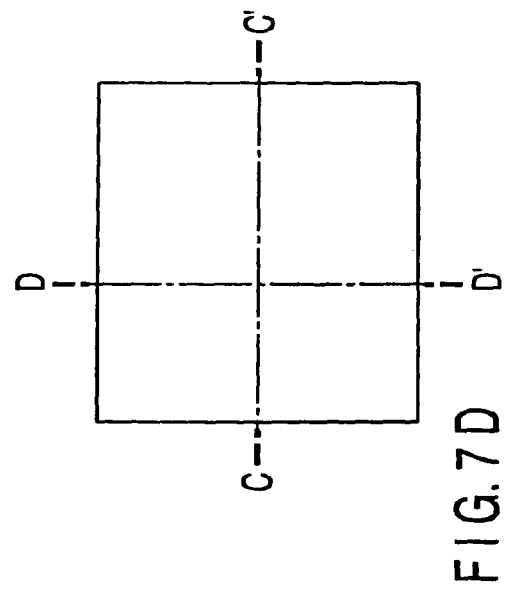
Figure 9A:
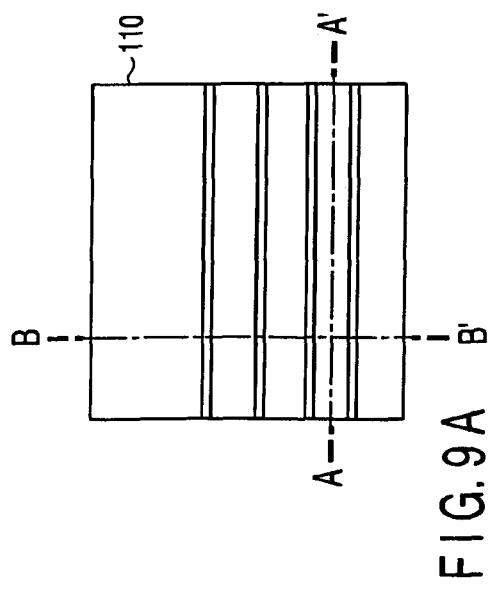
FIGS. 9A to 9F are plan views and cross sectional views for describing the manufacturing method of the NAND flash memory according to the first embodiment of the present invention subsequent to the FIGS. 8A to 8F.
Figure 9B:
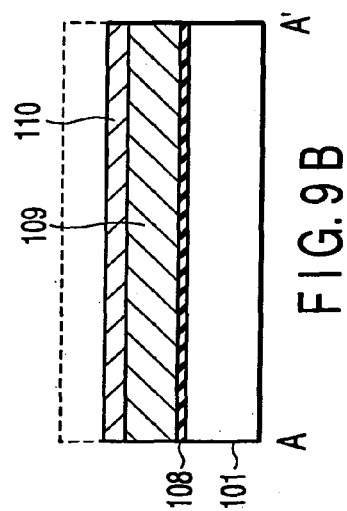
Figure 9C:
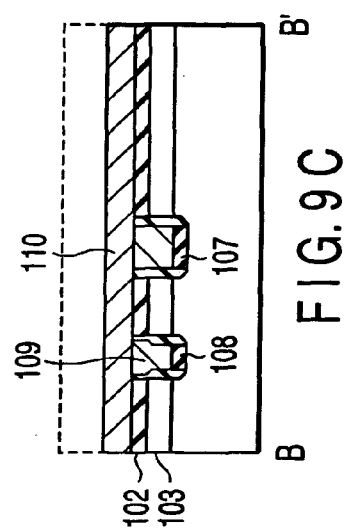
Figure 9D:
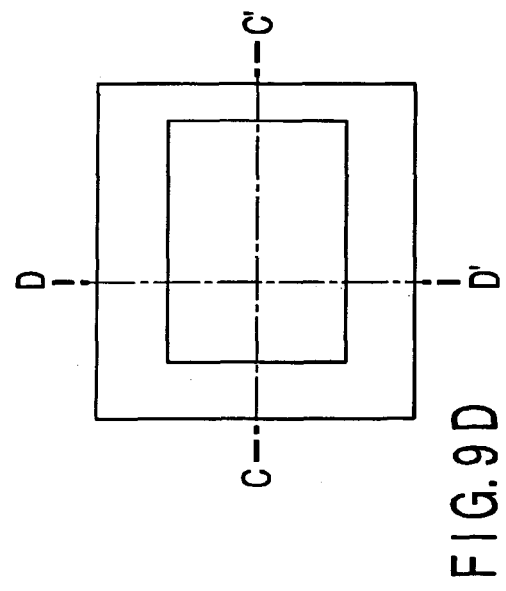
Figure 9E:
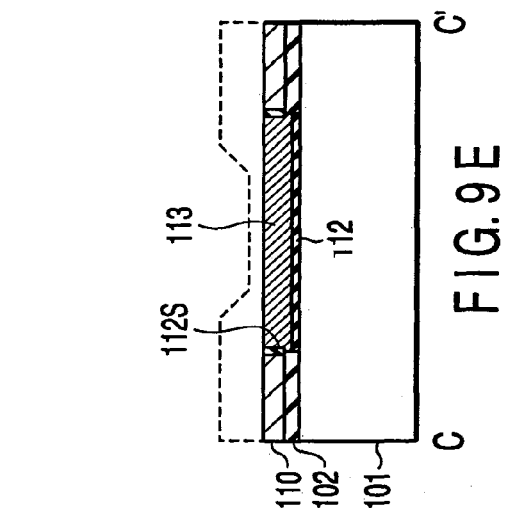
Figure 9F:
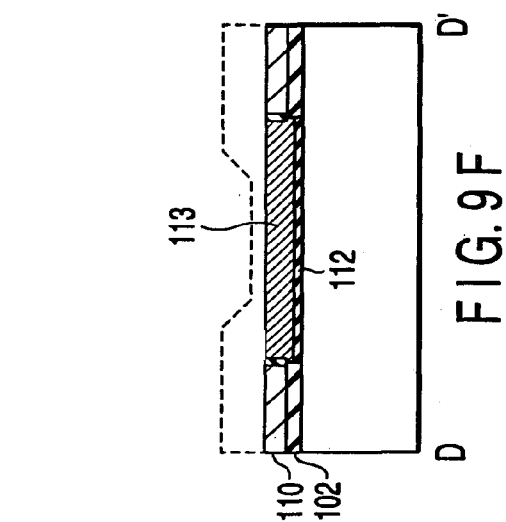
Figure 13C:
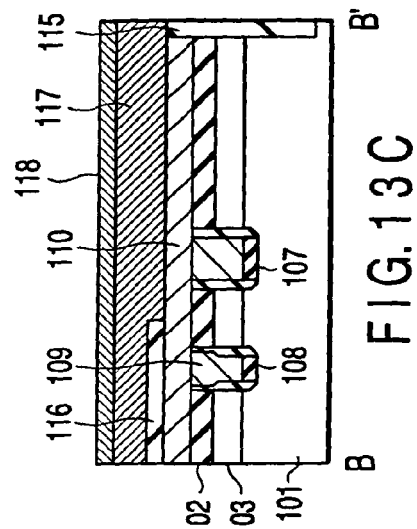
FIGS. 13A to 13F are plan views and cross sectional views for describing the manufacturing method of the NAND flash memory according to the first embodiment of the present invention subsequent to the FIGS. 12A to 12F.
Figure 13F:
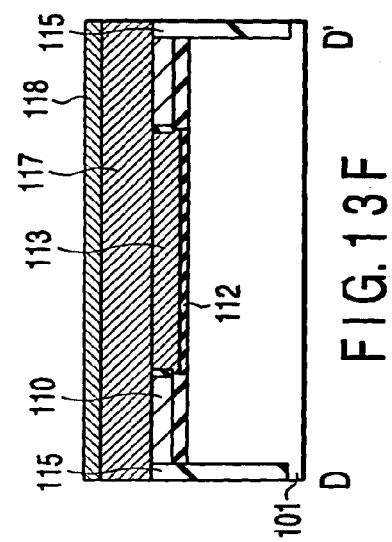
Figure 13B:
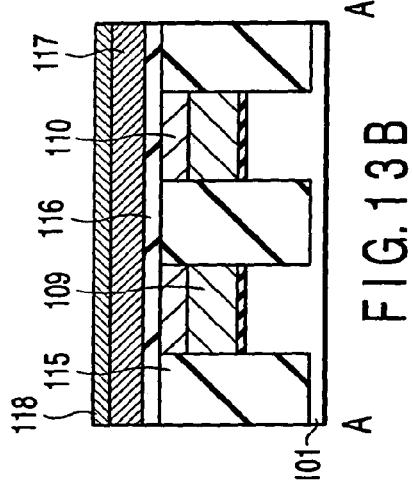
Figure 13E:
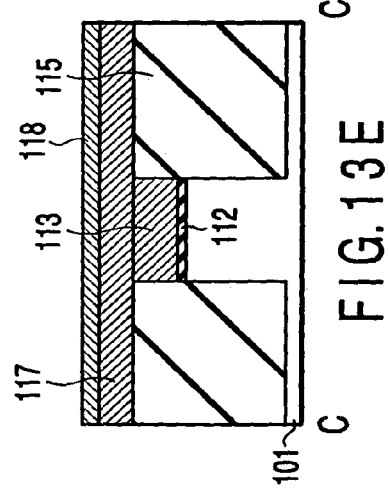
Figure 13A:
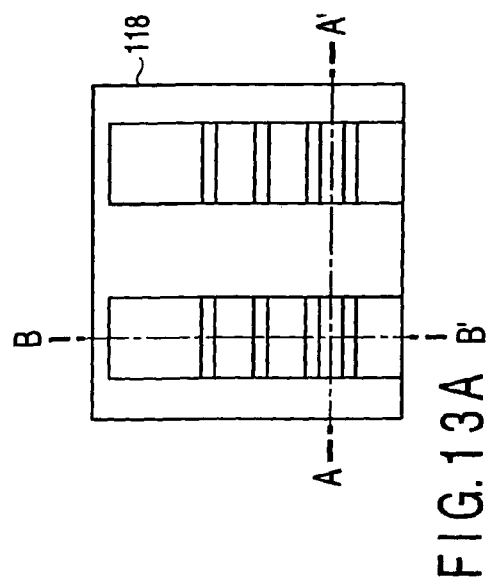
Figure 13D:
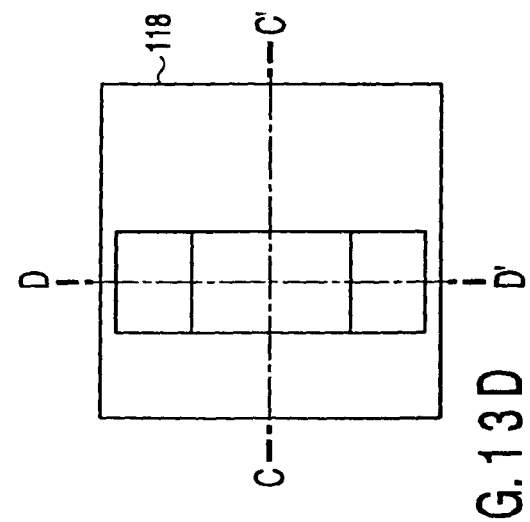
Figure 14C:
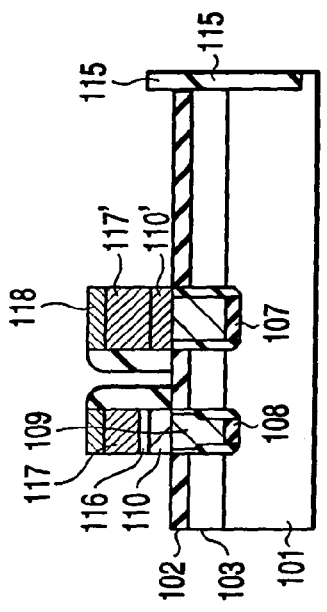
FIGS. 14A to 14F are plan views and cross sectional views for describing the manufacturing method of the NAND flash memory according to the first embodiment of the present invention subsequent to the FIGS. 13A to 13F.
Figure 14B:
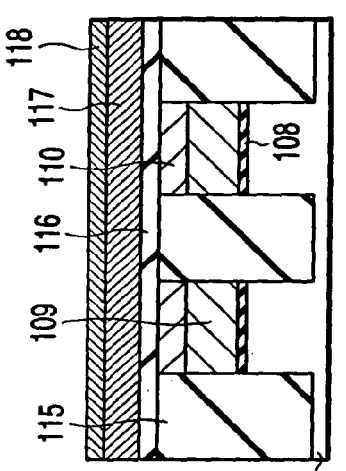
Figure 14A:
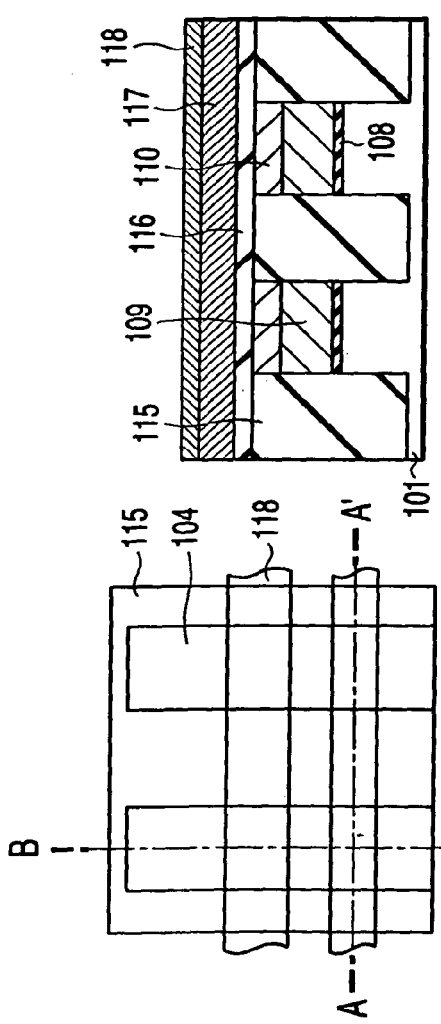
Figure 14F:
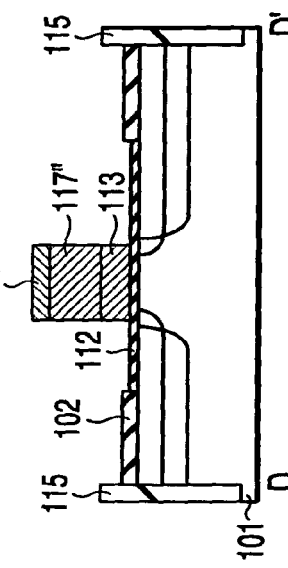
Figure 14E:
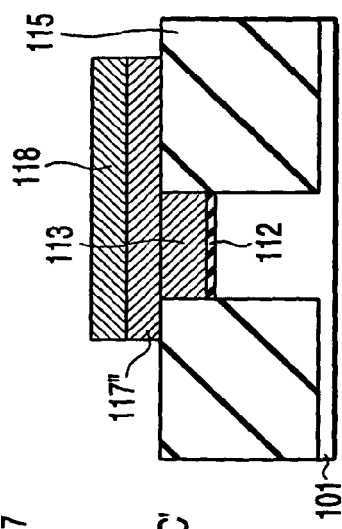
Figure 14D:
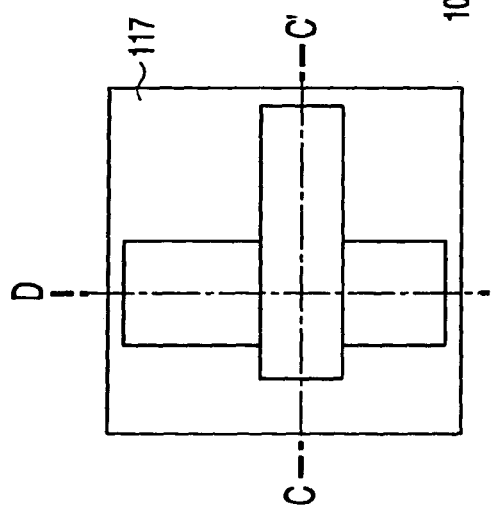

The method of manufacturing the NAND flash memory according to the first embodiment will now be described with reference to FIGS. 4A to 4F to FIGS. 18A to 18F. Throughout FIGS. 4A to 18F, each of the drawings marked "A" such as FIG. 4A denotes a plan view showing a part of FIG. 1. Each of the drawings marked "B" such as FIG. 4B is a cross sectional view along the line A-A' shown in each of the drawings marked "A". Each of the drawings marked "C" such as FIG. 4C is a cross sectional view along the line B-B' shown in each of the drawings marked "A". Each of the drawings marked "D" such as FIG. 4D is a plan view showing the control circuit section formed in the same chip. Each of the drawings marked "E" such as FIG. 4E is a cross sectional view along the line C-C' shown in each of the drawings marked "D". Each of the drawings marked "F" such as FIG. 4F is a cross sectional view along the line D-D' shown in each of the drawings marked "D".

At first, as shown in FIGS. 4A to 4F, a P-type silicon substrate 101 is prepared, thereafter, a P-well (not shown) and an N-well (not shown) are selectively formed in desired positions on the surface of the silicon substrate 101 by lithography process, ion implantation process and annealing process.

Next, a silicon oxide film 102 is formed in a thickness of, for example, about 10 nm on the surface of the silicon substrate 101. Thereafter, low impurity concentration impurity layers to be low impurity concentration impurity source/drain diffusion layers 103 of the transistor in the memory cell section are formed on the surface of the silicon substrate 101 by lithography process and ion implantation process. Here, n-type impurity ions such as phosphorus (P) ions are implanted into the surface regions of the silicon substrate 101 so as to form low impurity concentration n-type impurity layers. Thereafter, the impurity layers are annealed so as to form the source/drain diffusion layers 103.

Next, a silicon nitride film ($Si_3N_4$ film) 104 is formed on the entire surface. The thickness of the silicon nitride film 104 is, for example, about 50 nm. Next, the silicon nitride film 104, the silicon oxide film 102, the source/drain diffusion layers 103, and the silicon substrate 101 are sequentially etched by lithography process and RIE (Reactive Ion Etching) process so as to form a trench (concavity) 105.

Here, the side wall of the trench 105 is perpendicular to the surface of the silicon substrate 101, however, the side wall may be slope so that the width of the trench 105 is gradually decreased toward the bottom. For example, the side wall may have a slope of 85 degrees against the surface of the silicon substrate 101.

The bottom corner of the trench 105 may have a round shape whose radius is about 5 nm. In the case where the shape is employed, the trench 105 is easily filled with a film, and the stress concentration on the bottom corner portion of the trench 105 is released.

Next, as shown in FIGS. 5A to 5F, a silicon oxide film 106S is formed on the side wall of the trench 105. The process of forming the silicon oxide film 106S includes the step of depositing a $TEOS-SiO_2$ film in a thickness of about 20 nm by LP-CVD process on the entire surface, and the step of selectively etching the $TEOS-SiO_2$ film by RIE process so as to permit the $TEOS-SiO_2$ film to be selectively left on the side wall of the trench 105.

Next, a gate insulating film 107 is formed on the bottom portion of the trench 105 by oxidation. Here, the gate insulating film 107 has a thickness of 10 nm. That is, the gate insulating film 107 differs in thickness from a tunnel insulating film 108. To be more specific, the tunnel insulating film 108 is thicker than the gate insulating film 107.

Next, a resist film (not shown) covering a select transistor section is formed by the ordinary lithography process, the gate insulating film 107 in the memory cell section is removed by wet etching process using the resist film as a mask. Accordingly, the surface of the silicon substrate 101 at the bottom of the trench 105 in the memory cell section is exposed. Also, the silicon oxide film 106S on the side wall of the trench 105 in the memory cell section is rendered thinner than the silicon oxide film 106S on the side wall of the trench 105 in the select transistor section.

Next, the resist film is peeled off, thereafter, the tunnel insulating film 108 is formed on the bottom portion of the trench 105 in the memory cell section by oxidation. Here, The tunnel insulating film 108 is a silicon oxide film having a thickness of about 7 nm. As the tunnel insulating film 108, a laminated film of a silicon oxide film and a silicon nitride film or an insulating film obtained by nitriding a silicon oxide film may be used.

At this time, the silicon oxide film 106S on the side wall of the trench 105 in the memory cell section is also oxidized. The oxidizing rate of each of the silicon oxide film 102 and the silicon nitride film 104 is lower than the oxidizing rate of the source/drain diffusion layers (silicon layers) 103.

Accordingly, the silicon oxide film 106S on the side wall of the trench 105 in the memory cell section is converted into the silicon oxide film 106C whose lower portion (on the side of the vicinity of the tunnel insulating film 108) is thicker than upper portion. The thickness of lower portion (on the side of the vicinity of the tunnel insulating film 108) of the silicon oxide film 106C is about 13 nm, the thickness of upper portion of the silicon oxide film 106C is about 8 nm.

Next, as shown in FIGS. 6A to 6F, the first polycrystalline silicon film 109 to be processed into the first FG electrode is deposited on the entire surface so as to fill the trench 105, thereafter, the first polycrystalline silicon film 109 is etched back by CMP (Chemical Mechanical Polishing) process. In this way, the first polycrystalline silicon film 109 buried in the trench 105 is formed. It is desirable for the first polycrystalline silicon film 109 to be buried in the trench 105 such that the upper surface of the first polycrystalline silicon film 109 is flush with the near the upper surface of the silicon oxide film 102.

It is important to pay attentions to the relationship in area between the first polycrystalline silicon film 109 and the tunnel insulating film 108. The channel length of the transistor in the present embodiment is obtained by subtracting the thickness of the silicon oxide film 106C from the width of the trench 105.

For example, in the case where the width of the trench 105 is 70 nm, the channel length in the upper region of the first FG electrode 109 is about 54 nm because the upper portion of the silicon oxide film 106C has a thickness of about 8 nm. On the other hand, the channel length of the region in which the tunnel insulating film 108 is formed, i.e., the channel length in the lower region of the first FG electrode 109, is about 44 nm because the thickness in the lower portion of the silicon oxide film 106C is about 13 nm. In this way, in the present embodiment, the area of the region for forming the tunnel insulating film 108 corresponding to the first FG electrode 109 is smaller than the area in the upper portion of the first FG electrode 109.

Next, as shown in FIGS. 7A to 7F, the silicon nitride film 104 is removed by a hot phosphoric acid solution, thereafter, the silicon oxide films 106S and 106C remaining on the surface is removed by employing, for example, CMP process.

Next, as shown in FIGS. 8A to 8F, the second polycrystalline silicon film 110 to be processed into the second FG electrode is deposited on the entire surface, thereafter, a cap silicon nitride film 111 is deposited on the second polycrystalline silicon film 110. At that time, the second polycrystalline silicon film 110 is formed so as to permit the second polycrystalline silicon film 110 to be connected to the first FG electrode with a low electrical resistance.

Next, the second polycrystalline silicon film 110 and the cap silicon nitride film 111 in the region of a control circuit section are selectively removed by d etching. Thereafter, the silicon oxide film 102 in the region of the control circuit section is removed so as to expose the surface of the silicon substrate 101.

Next, a gate insulating film 112 of the transistor in the control circuit section is formed on the exposed surface of the silicon substrate 101. Here, the gate insulating film 112 is a silicon oxide film formed by thermal oxidation. On that account, a silicon oxide film 112S is formed on the exposed side surface of the second polycrystalline silicon film 110 at the forming of the gate insulating film 112.

Incidentally, it is possible to form, if necessary, the gate insulating film 112 including a plurality of sections having a plurality of thickness. For example, it is possible to form a gate insulating film having a thickness of about 3 nm in the control circuit section requiring a high speed operation and a thickness of about 40 nm in a high voltage circuit section requiring a high withstand voltage. The gate insulating film 112 including the plurality of sections having the plurality of thickness is formed by ordinary lithography process and wet etching process.

Next, as shown in FIGS. 9A to 9F, the third polycrystalline silicon film 113 to be processed into the a gate electrode in the control circuit section is deposited on the entire surface, thereafter, by using CMP process, the third polycrystalline silicon film 113 is polished such that the third polycrystalline silicon film 113 is rendered nearly flush with the second polycrystalline silicon film. At that time, the cap silicon nitride film 111 is used as a stopper mask for the CMP.

In this way, the third polycrystalline silicon film 113 is buried in the opening formed by the process shown in FIGS. 8A to 8F in the second polycrystalline silicon film 110 and the silicon oxide film 102 in the control circuit region.

Here, the polycrystalline silicon film 113 is used as the gate electrode of the control circuit section, alternatively, it is also possible to use, for example, a silicide film (a $WSi_2$ film, a $CoSi_2$ film or a NiSi film, and so on) or a metal film (a W film, and so on) as the gate electrode of the control circuit section.

Also, it is possible to use an $N^+$-type polycrystalline silicon film having a high concentration of an N-type impurity such as arsenic (As) as the gate electrode of the N-channel transistor included in the control circuit section and to use a $P^+$-type polycrystalline silicon film having a high concentration of a P-type impurity such as boron (B) as the gate electrode of the P-channel transistor included in the control circuit section.

Next, as shown in FIGS. 10A to 10F, a process for forming an STI trench proceeds.

At first, a silicon nitride film 114A is deposited on the entire surface in a thickness of about 70 nm by LP-CVD process, followed by depositing a $TEOS-SiO_2$ film 114B on the silicon nitride film 114A in a thickness of about 100 nm by LP-CVD process, thereafter, the silicon nitride film 114A and the $TEOS-SiO_2$ film 114B is patterned by the ordinary lithography process and RIE process so as to form a laminated mask layer 114 including the silicon nitride film 114A and the $TEOS-SiO_2$ film 114B.

Next, the first to third polycrystalline silicon films 109, 110, 113, the oxide-based insulating films 108, 107, 112S, 102, the source/drain diffusion layers, and the silicon substrate 101 are sequentially etched by RIE process using the laminated mask layer 114 as a mask, thereby the STI trench is formed.

The STI trench has a depth of, for example, about 200 nm as measured from the surface of the silicon substrate 101. The width of the STI trench is, for example, about 70 nm (memory cell section). Of course, since the STI trench is a trench for the isolation, the STI trenches having various widths are formed on the surface of the silicon substrate 101.

Here, present embodiment covers an example in which the $SiO_2$ film 114B is laminated on the silicon nitride film ($Si_3N_4$ film) 114A, and the $SiO_2$ film 114B is used as an etching mask member of the silicon substrate 101.

Also, the present embodiment covers an example in which the STI trench has a perpendicular side wall. However, it is also possible for the trench to have a side wall that is not perpendicular to the surface of the silicon substrate 101. For example, it is possible to use a trench having a side wall that is inclined to make an angle θ of, for example, about 85° with the surface of the silicon substrate 101 such that the width of the trench is gradually decreased in the depth direction toward the bottom of the trench. Further, the bottom corner of the trench may have a round shape whose radius is about 5 nm.

In the case where the shape is employed into the STI trench, the filling of trench is improved. That is, the inside of the STI trench is easily filled with an insulating film.(isolation insulating film). Further, the stress concentration on the bottom corner portion of the STI trench is released.

As the STI trench is formed, the shapes of the tunnel insulating film 108, the first FG electrode 109 and the second FG electrode 110 in the direction parallel to the word line is determined in self-alignment manner.

Next, as shown in FIGS. 11A to 11F, the side surface of the STI trench formed on the surface of the silicon substrate 101 is oxidized by the ordinary thermal oxidation method so as to form a thermal oxide film (not shown) having a thickness of about 3 nm on the side surface of the STI trench.

Here, if the side surface of the STI trench is oxidized by an oxidizing method using an oxygen radical in place of the thermal oxidation method, a silicon oxide film is formed without being influenced by the planar direction of silicon (Si). Therefore, a silicon oxide film having an uniform thickness and high quality is formed on the side surface of the STI trench. The side surface of the STI trench may be oxidized by an ISSG (In-Situ Steam Generation) method.

Next, an insulating film (isolation insulating film) 115 is deposited on the entire surface so as to fill the STI trench, thereafter, the insulating film 115 is etched back by CMP process such that the surface of the silicon nitride film 114A is rendered nearly flush with the surface of the insulating film 115.

Here, in the case where the STI trench has a large aspect ratio, as the insulating film 115, it is better to use an HDP-$CVD-SiO_2$ film or a coated film using polysilazane as the source. It is important to fill simultaneously and uniformly the STI trench corresponding to a large STI width and the STI trench corresponding to a small STI width.

In the case of the conventional structure, the FG electrode has a large thickness and, thus, the STI trench has a large aspect ratio. Accordingly, it is not easy to fill the STI trench with an insulating film. On the other hand; in the case of the present embodiment, a part of the FG electrode (i.e., the first FG electrode 109) is buried in the STI trench formed in the silicon substrate 101 before the STI trench is filled with the insulating film 115. Such being the situation, the aspect ratio of the STI trench before the STI trench is filled with the insulating film 115 is larger than that in the conventional case.

However, as the miniaturization progresses, the aspect ratio becomes larger, so difficulty in filling the STI trench with an insulating film aries. Therefore, it is difficult to completely fill the TI trench with the HDP-$CVD-SiO_2$ film alone. In such a case, it is advisable to employ a hybrid STI filling technology. The hybrid STI filling technology will now be described in detail.

Figure 26A:
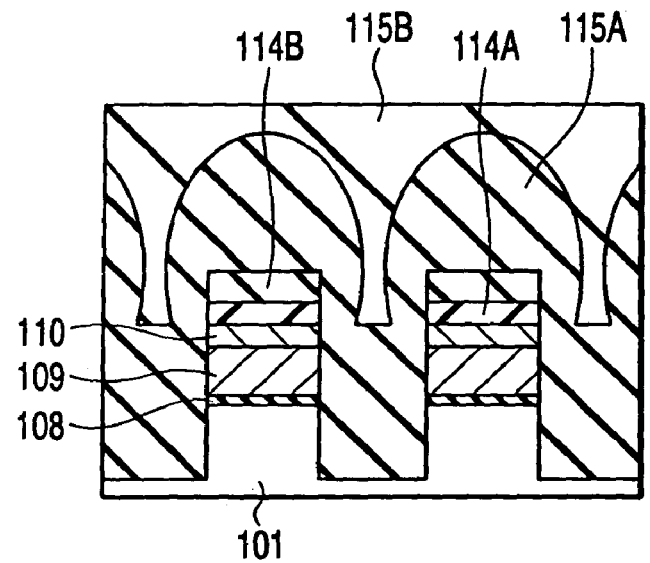
FIGS. 26A and 26B are cross sectional views for explaining an example of the hybrid STI filling technology.

In the hybrid STI filling technology, as shown in FIG. 26A, the lower portion of the STI trench is filled with an HDP-$CVD-SiO_2$ film 115A, the upper portion of the STI trench is filled with an $SiO_2$ film 115B formed by coating technology.

The filling of the upper portion of the STI trench is performed, for example, by forming a film of silazane-perhydride polymer (hereinafter referred to as a PSZ film) having a thickness of, for example, about 400 nm on a region including the STI trench by coating method.

After formation of the PSZ film, a baking treatment in which the solvent is evaporated at about 150° C. is carried out for about 3 minutes. The coating technology exhibits satisfactory filling properties. On that account, a narrow STI trench having a width of about 70 nm can be filled with the PSZ film free from void.

Next, the PSZ film is converted into the $SiO_2$ film 115B. The process can be explained by chemical formula (1) given below:

$$SiH_2NH + 2O \rightarrow SiO_2 + NH_3 \quad (1)$$

That is, the conversion of PSZ film into the $SiO_2$ film 115B arises from the generation of $SiO_2$ and $NH_3$ (ammonia gas) cased by reaction between the PSZ film and oxygen (O) generated by the decomposition of the water vapor ($H_2O + O_2$).

At that time, as the surface of the silicon substrate 101 in the active area (element forming region.) is covered with the silicon nitride film ($Si_3N_4$ film), the surface of the silicon substrate 101 in the active area is not oxidized.

In order to bring about the chemical reaction referred to above, it suffices to carry out a combustion oxidation (i.e., BOX oxidation) for about 30 minutes under a water vapor atmosphere of about 200° C. to 600C. For example, if the BOX oxidation is carried out at 400° C. for about 30 minutes, the conversion from the Si—N bond into the Si—O bond is promoted within the PSZ film. Accordingly, the PSZ film buried in the STI trenches having various widths is converted into the $SiO_2$ film to the extent that event the PSZ film on the bottom of the STI trench is completely converted into the $SiO_2$ film.

In the BOX oxidation process described above, it is possible to employ a so-called "two-stage oxidation method" in which the oxidizing process is carried out first for about 30 minutes under the atmosphere containing a water vapor of about 200° C., thereafter, atmosphere is changed to an oxygen atmosphere, further, the temperature is elevated to high temperatures of about 400 to 800° C. so as to carry out the oxidizing process under the oxygen atmosphere for about 30 minutes.

In the case of employing the two-stage oxidizing method described above, the efficiency of the conversion from the PSZ film into the $SiO_2$ film 115B is enhanced. If the conversion efficiency is enhanced, the impurities such as carbon (C) remaining in the PSZ film is removed.

The two-stage oxidizing method is a method that is particularly effective for the conversion of the PSZ film into a $SiO_2$ film. It is important to hold the PSZ film for a certain time under the water vapor atmosphere at a temperature that the conversion from the PSZ film into the $SiO_2$ film is starts (for example, about 400° C.).

When it comes to the water vapor atmosphere, a water vapor atmosphere having a high water concentration formed by hydrogen combustion oxidation is suitable for the conversion of the PSZ film into the $SiO_2$ film. It is desirable for the water concentration to be 80% or higher.

Next, a heat treatment under an oxidizing atmosphere or an inert gas atmosphere such as a nitrogen gas atmosphere is carried out for about 30 minutes at an arbitrary temperature falling within a range of between 700° C. and 1,000° C., e.g., at the temperature of about 800° C. By the heat treatment (densifying treatment), $NH_3$ and $H_2O$ remained in the $SiO_2$ film 115B ($SiO_2$ film converted from the PSZ film) are released to the outside so as to densitfy the $SiO_2$ film 115B. Accordingly, the leakage current in the $SiO_2$ film 115B is reduced.

In the case Where the heat treatment is carried out under the oxygen atmosphere, the impurity concentration such as the carbon (C) concentration within the $SiO_2$ film 115B is reduced. Accordingly, the leakage current is further reduced, and also fixed charge at the interface between the $SiO_2$ film 115B and the silicon substrate 101 is reduced. On the other hand, in the case where the heat treatment is carried out under the inert gas atmosphere such as a nitrogen gas atmosphere, the oxidation of silicon on the side surface of the STI trench is suppressed. Accordingly, the reduction in the width of the element (i.e., the increase in the width of the STI trench) is suppressed.

The heat treatment employed in the densifying process of the $SiO_2$ film 115B includes another heat treatment such as an RTA (Rapid Thermal Annealing) and RTO (Rapid Thermal Oxidation) in addition to the heat treatment using the ordinary furnace. In the case of employing the RTA method, a high temperature heat treating process can be carried out under a higher temperature in a shorter time, compared with the heat treatment using the ordinary furnace.

Figure 26B:
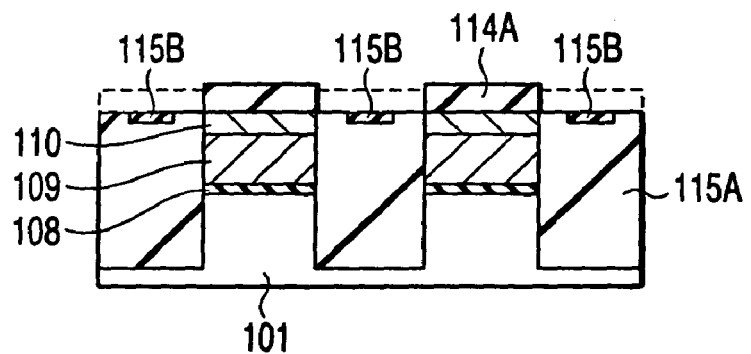
Figure 27A:
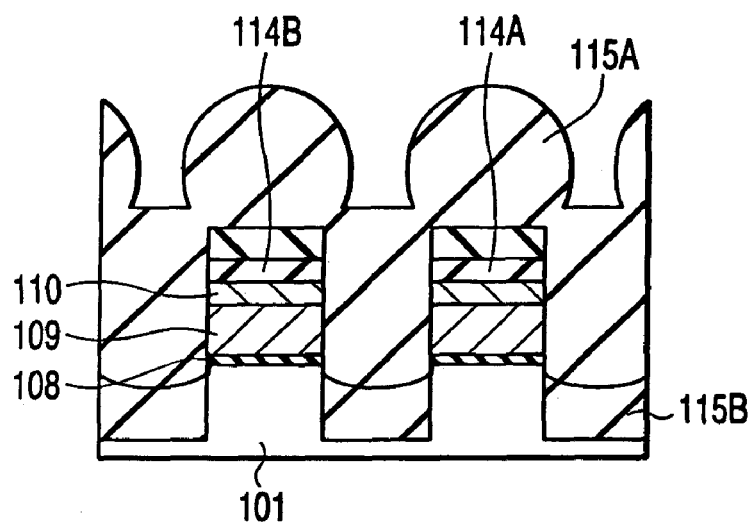
FIGS. 27A and 27B are cross sectional views for explaining another example of the hybrid STI filling technology.
Figure 27B:
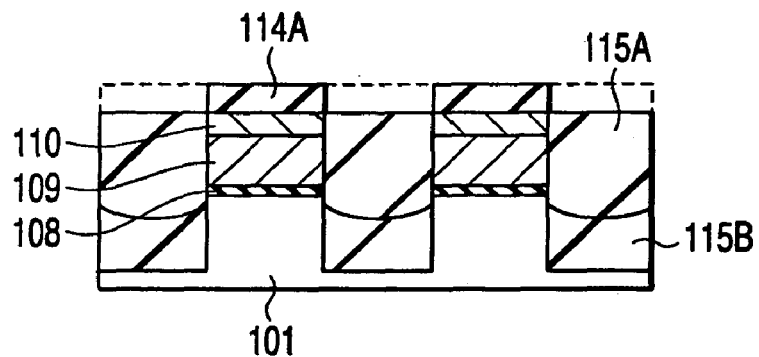
Figure 28:
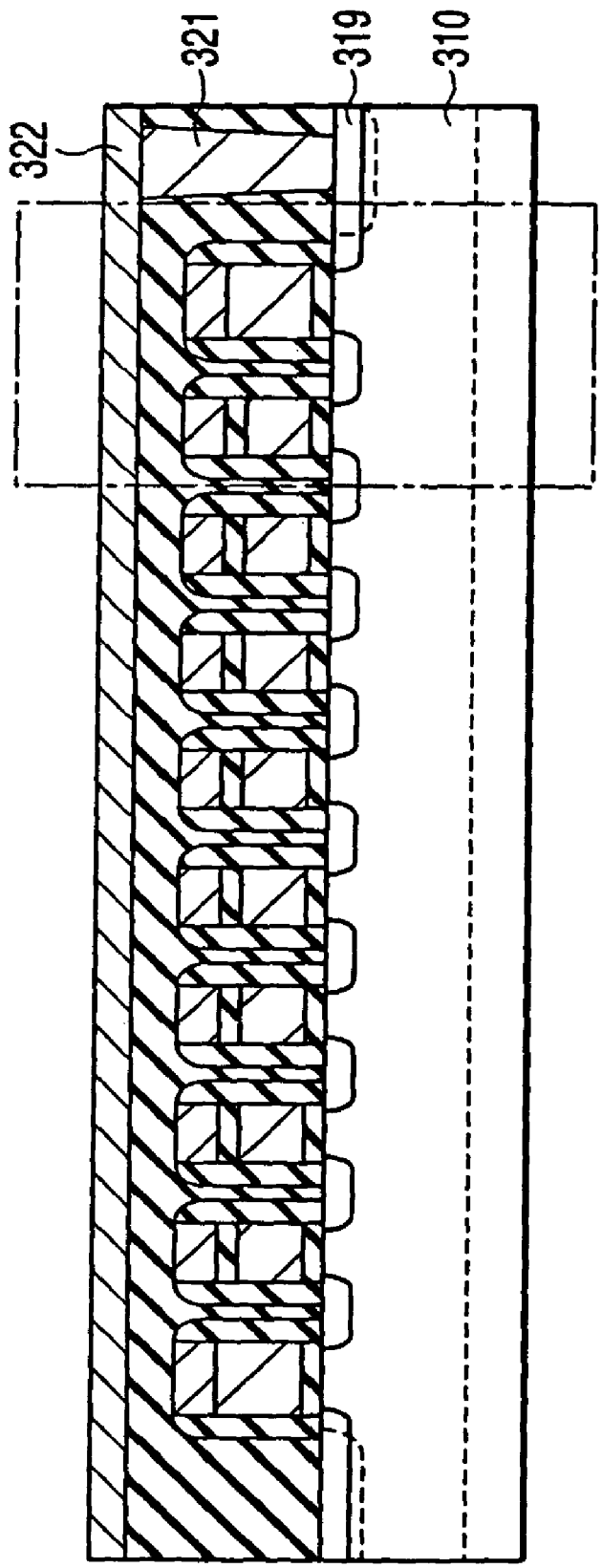
FIG. 28 is a cross sectional view showing a conventional the memory cell of NAND type flash memory in the direction of the bit line.
Figure 29:
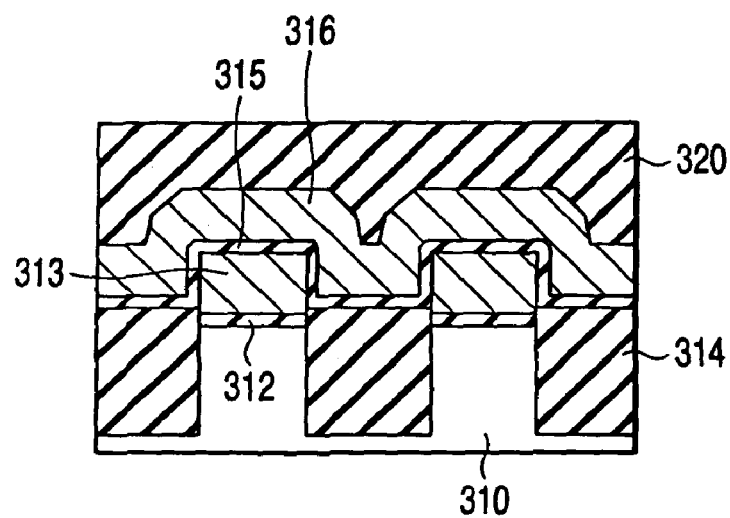
FIG. 29 is a cross sectional view showing the conventional the memory cell of NAND type flash memory in the direction of the word line.
Figure 30:
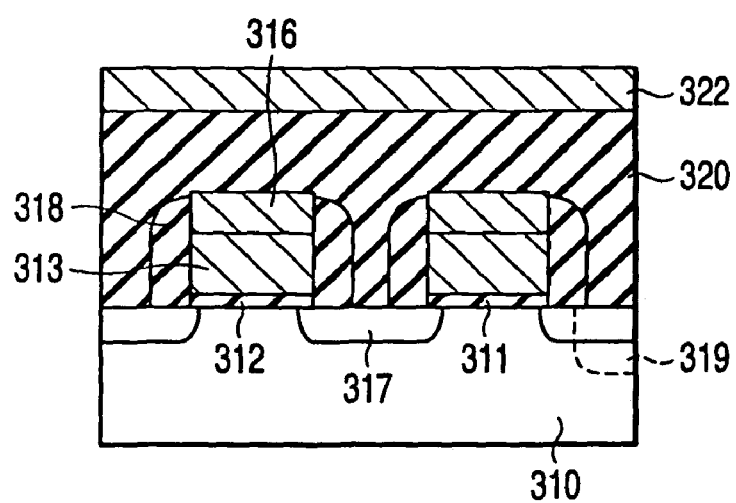
FIG. 30 shows in an enlarged view in a region surrounded by a dot-and-slash line shown in FIG. 28.

Next, as shown in FIG. 26B, the $SiO_2$ films 115A and 115B are planarized by CMP process and the surface of the silicon nitride film 114A is exposed. After the planarization by CMP process, a heat treatment under a nitrogen gas ($N_2$) atmosphere of 850° C. may be carried out It is possible for the STI trench to be filled with the coated film alone. Also, it is possible to change the burying order. For example, as shown in FIGS. 27A and 27B, a coated film such as a PSZ film is formed in the STI trench, thereafter, a suitable heat treatment is carried out so as to convert the PSZ film into the $SiO_2$ film 115B, further, the HDP-CVD-$SiO_2$ film 115A is formed on the $SiO_2$ film 115B so as to permit the STI trench to be filled with the $SiO_2$ film 115A. Thereafter, the surface is planarized by, for example, the CMP process.

With progress of the miniaturization in the width of the STI trench from 70 nm to 50 nm and, further, to 40 nm, it is rendered difficult for the STI trench to be filled with the HDP-$SiO_2$ film. How to fill a fine STI trench is an important question on the manufacturing process.

Next, as shown in FIGS. 12A to 12F, the silicon nitride film 114A is removed by wet etching process using, for example, using a hot phosphoric acid so as to expose the surface of the second FG electrode 110. Then, an interpoly insulating film 116 is formed on the region including the exposed surface of the second FG electrode 110.

As the interpoly insulating film 116, a high-k insulating film such as an ONO film (oxide film-silicon nitride film-oxide film) or an $Al_2O_3$ (alumina) film formed by ALD (Atomic Layer Deposition)-CVD process may be used. The $Al_2O_3$ (alumina) film has a thickness of, for example, about 14 nm. Since under layer of the interpoly insulating film 116 is flat, it is possible to use an alumina film formed by sputtering process in place of the alumina film formed by ALD-CVD process.

The high-k film need not be of a single layer structure. It is also possible to use a laminate structure such as a $Si_3N_4$/$Al_2O_3$/$Si_3N_4$ film or an $Al_2O_3$/$HfO_2$/$Al_2O_3$ film as the high-k film.

Next, the interpoly insulating film 116 in the region other than the region where a memory cell having a FG structure is formed on, e.g., the interpoly insulating film 116 in the region where a select transistor and a control circuit, is selectively removed by etching process so as to expose the surfaces of the second FG electrode 110 and the gate electrode 113.

Next, as shown in FIGS. 13A to 13F, the fourth polycrystalline silicon film 117 to be processed into the CG electrode is formed on the entire surface, thereafter, a mask layer 118 forming of a silicon nitride film ($Si_3N_4$ film) or a silicon oxide film is formed on the fourth polycrystalline silicon film 117.

The fourth polycrystalline silicon film 117 has a thickness of, for example, about 200 nm. Here, a polycrystalline silicon film is used for the CG electrode, however, it is also possible to use a film formed of a silicide material containing W, Co, Ni or Ti. For example, a polycide film (e.g., laminated film such as $WSi_2$/polycrystalline silicon film or $CoSi_2$/polycrystalline silicon) or a poly-metal film (e.g., W/WN/polycrystalline silicon film) may be used.

Further, as a stepped portion corresponding to the difference in the thickness of the films is brought about, the control gate section may be planarized by planarizing process such as a CMP process before the processing.

Next, as shown in FIGS. 14A to 14F, the mask layer 118, the third polycrystalline silicon film 113, the fourth polycrystalline silicon film 117, the interpoly insulating film 116, and the second polycrystalline silicon film 110 are processed successively by the ordinary lithography process and RIE process so as to form the CG electrode 117 and the second FG electrode 110 in the memory cell section and the gate electrodes 110', 117' of the select transistor section, and the gate electrodes 113, 117'' of the control circuit section.

In order to prevent the surface of the silicon substrate 101 from causing etching damage in the etching step of the third polycrystalline silicon film 113 in the control circuit section, it is necessary to select the conditions of the RIE process such that the etching rate of the gate insulating film ($SiO_2$ film) 112 is rendered sufficiently lower than the etching rate of the third polycrystalline silicon film 113.

Also, because of the formation of the CG electrode 117, the shapes of the second FG electrode 110 and the interpoly insulating film 116 in a direction parallel to the bit line are determined by self-alignment.

Next, oxide films (not shown) are formed by the oxidation of the side surfaces of the CG electrode 117 and the FG electrode 110 in the memory cell section, the gate electrodes 110' and 117' in the select transistor section, and the gate electrodes 113 and 117'' of a peripheral transistor. The peripheral transistor is a transistor having a planar channel structure. That is, the semiconductor device according to the present embodiment comprises both a transistor having a trench type channel structure and a transistor having a planar channel structure.

Next, as shown in FIGS. 15A to 15F, the source/drain diffusion layers 119 of the transistor included in the control circuit section, the diffusion layers 119 having a low impurity concentration, are formed by the ordinary lithography process and ion implantation process. The conductivity type of the source/drain diffusion layers 119 is an $N^-$type in the case of an N-channel transistor and a $P^-$type in the case of a P-channel transistor.

Next, a spacer 121 is formed on the side walls of the gate electrode 113, the FG electrode 110 and the mask layer 118. The process of forming the spacer 121 comprises the step of depositing an insulating film to be processed into the spacer 121 on the entire surface and the step of etching the entire surface of the insulating film so as to selectively leave the insulating film on the side walls. The insulating film noted is, for example, a TEOS-$SiO_2$ film formed by LP-CVD process.

Next, source/drain diffusion layers 120 and 122 having high impurity concentrations of the memory cell section and the control circuit section are formed by the ordinary lithography process and ion implantation process. It is possible for the source/drain diffusion layers 120 and 122 to be formed in different steps or in the same step.

It is possible to employ a halo implanting process (not shown) in the step in order to prevent the occurrence of a punch through in the transistor included in the control circuit section. Incidentally, if the length of the gate electrode is decreased, the adjacent layers formed by halo implanting process are caused to be shaped to overlap each other. Even in such a case, satisfactory transistor characteristics can be realized by optimizing the amount of the ion implantation. Also, it is possible to form an impurity layer for preventing the punch through in a desired region by ion implanting process with the gate electrode used as a mask.

Known technologies are employed in the subsequent manufacturing process steps. That is, as shown in FIGS. 16A to 16F, an interlayer insulating film 123 is formed on the entire surface by CVD process, thereafter, a contact hole 124 for a bit line contact plug is formed. Next, as shown in FIGS. 17A to 17F, a bit line contact plug 125 and bit lines 126 are formed. Next, as shown in FIGS. 18A to 18C, an interlayer insulating film 127, a contact plug 128 and a wiring layer 129 are formed. Further, a passivation film (not shown), a pad (not shown), etc. are formed so as to finish manufacture of a semiconductor device.

According to the first embodiment of the present invention, it is possible to obtain prominent effects as summarized below:

(1) Since the tunnel insulating film is formed in self-alignment manner on a region smaller than the size determined by the limit of the lithography process, the coupling ratio of ($C2/(C1+C2)$) is improved, Accordingly, the writing voltage is lowered.

(2) Since the concave transistor structure is employed, the SCE (short channel effect) is suppressed.

(3) Since the diffusion layer having a high impurity concentration is used as the source/drain diffusion layers 120 of the memory cell array, the resistance of the source/drain diffusion layers and the parasitic resistance are lowered, Accordingly, the current for the read out is increased.

(4) Since the area in the lower portion of the FG electrode (first FG electrode 109) is made smaller than the area in the upper portion of the FG electrode (second FG electrode 110) in self-alignment manner, the coupling ratio of ($C2/(C1+C2)$) is improved, Accordingly, the writing voltage is lowered.

Second Embodiment

FIGS. 19A to 19F to FIGS. 25A to 25F are plan views and cross sectional views showing the process steps during the manufacturing process of a NAND flash memory according to the second embodiment of the present invention. In the following drawings, The portions corresponding to the portions shown in the previously mentioned drawings are denoted by the same reference numerals and omitted its detail explanation.

The FG electrode of the first embodiment comprises the first FG electrode provided in the trench and the second FG electrode provided outside the trench, the FG electrode of the present embodiment comprises the first FG electrode, but does not comprise the second FG electrode. That is, in the second embodiment, the entire FG electrode is buried in the trench.

Such the structure permits simplifying the manufacturing process. Further, since it is possible to decrease the thickness of the FG electrode, the coupling capacitance between the adjacent FG electrodes is reduced, and the writing characteristics and the erasing characteristics are stabilized. Accordingly, the reliability in the operation of the product semiconductor device is improved.

At first, the processes shown in FIGS. 4A to 4F to FIGS. 7A to 7F of the first embodiment are carried out.

In the case of the present embodiment, the entire FG electrode is buried in the trench and, thus, the width of the FG electrode 109 is determined by the channel length direction defined by the trench 105 in self-alignment manner.

Next, as shown in FIGS. 19A to 19F, a silicon nitride film 210 is deposited on the entire surface. The thickness of the silicon nitride film 210 is, for example, about 100 nm.

Next, a part of the silicon nitride film 210 and a part of the silicon oxide film 102 (the part where the transistor is formed) in the control circuit section are selectively removed by etching process. A surface of the region of the silicon substrate 101 where the silicon nitride film 210 and the silicon oxide film 102 are removed is exposed.

Next, a gate insulating film of a transistor in the control circuit section is formed on the exposed surface of the silicon substrate 101. If necessary, the gate insulating film 112 including a plurality of sections having a plurality of thickness may be formed. For example, it is possible to form a gate insulating film having a thickness of about 3 nm in the control circuit section requiring a high speed operation and a thickness of about 40 nm in a high voltage circuit section requiring a high withstand voltage. The gate insulating film 112 including the plurality of sections having the plurality of thickness can be formed by the ordinary lithography process and a wet etching process.

Next, as shown in FIGS. 20A to 20F, the third polycrystalline silicon film 113 to be processed into the gate electrode in the control circuit region is deposited on the entire surface, thereafter, the third polycrystalline silicon film 113 polished by CMP process such that the upper surface of the third polycrystalline silicon film 113 is rendered nearly flush with the upper surface of the silicon nitride film 210. Here, the silicon nitride film 210 is used as the CMP process stopper mask.

In this way, the opening of the silicon oxide film 102 of the control circuit region, which is formed in the process of FIGS. 19A to 19F, is filled with the third polycrystalline silicon film 113.

It is possible to use an $N^+$-type polycrystalline silicon film having an N-type impurity such as arsenic (As) introduced therein in a high concentration as the gate electrode of the N-channel transistor in the control circuit section and a $P^+$-type polycrystalline silicon film having an P-type impurity such as boron (B) introduced therein in a high concentration as the gate electrode of the P-channel transistor in the control circuit section.

Next, as shown in FIGS. 21A to 21F, a process for forming an STI trench proceeds.

A first, the silicon nitride film 114A (thickness:
about 70 nm) is deposited on the entire surface by LP-CVD process, followed by depositing the $TEOS-SiO_2$ film 114B (thickness: about 100 nm) on the silicon nitride film 114A by LP-CVD process. Thereafter, the silicon nitride film 114A and the $TEOS-SiO_2$ film 114B are patterned by the ordinary lithography process and RIE process so as to form a laminated mask layer 114 including the silicon nitride film 114A and the $TEOS-SiO_2$ film 114B.

Next, etching is applied to the silicon nitride film 210, the first and third polycrystalline silicon films 109 and 113, the oxide-based insulating films 108, 107, 112, 102, the source/drain diffusion layers, and the silicon substrate 101 by RIE process with the 20 laminated mask layer 114 used as a mask so as to form an STI trench.

The STI trench has a depth of about 200 nm as measured from the surface of the silicon substrate 101.

Of course, STI trenches having various widths are formed on the surface of the silicon substrate 101 because the STI trench is a trench for isolation.

Here, the side wall of the trench is perpendicular to the surface of the silicon substrate, however, the side wall may be slope so that the width of the trench is gradually decreased toward the bottom. For example, the side wall may have a slope of 85 degrees against the surface of the silicon substrate. Further, the bottom corner of the trench may have a round shape whose radius is about 5 nm.

In the case where the shape is employed, the trench is easily filled with a film (an isolation insulating film), and the stress concentration on the bottom corner portion of the trench is released.

Next, as shown in FIGS. 22A to 22F, the side surface of the STI trench formed on the surface of the silicon substrate 101 is oxidized by the ordinary thermal oxidation method. Accordingly, a thermal oxide film (not shown) having a thickness of about 3 nm is formed on the side surface of the STI trench.

Here, if the side surface of the STI trench is oxidized by an oxidizing method using an oxygen radical in place of the thermal oxidation method, a silicon oxide film is formed without being influenced by the planar direction of silicon (Si). Therefore, a silicon oxide film having an uniform thickness and high quality is formed on the side surface of the STI trench. The side surface of the STI trench may be oxidized by an ISSG (In-Situ Steam Generation) method.

Next, an insulating film (isolation insulating film) 115 is deposited on the entire surface so as to fill the STI trench, thereafter, the insulating film 115 is etched back by CMP process such that the surface of the silicon nitride film 114A is rendered nearly flush with the surface of the insulating film 115.

Here, in the case where the STI trench has a large aspect ratio, the $HDP-CVD-SiO_2$ film, the coated film using polysilazane as the source, or the combination of these films (high hybrid structure) may be used as the insulating film 115. It is important to fill simultaneously and uniformly the STI trench corresponding to a large STI width and the STI trench corresponding to a small STI width.

Next, as shown in FIGS. 23A to 23F, the silicon nitride films 114 and 210 are removed by wet etching process using, for example, a hot phosphoric acid so as to expose the surfaces of the FG electrode 109 and the gate electrode 113. Then, an interpoly insulating film 116 is formed on the region including the exposed surface of the FG electrode 109.

As the interpoly insulating film 116, a high-k insulating film such as an ONO film or an $Al_2O_3$ (alumina) film formed by ALD-CVD process may be used. The $Al_2O_3$ (alumina) film has a thickness of, for example, about 14 nm. Since under layer of the interpoly insulating film 116 is flat, it is possible to use an alumina film formed by sputtering-process in place of the alumina film formed by ALD-CVD process.

The high-k film need not be of a single layer structure. It is also possible to use a laminate structure such as a $Si_3N_4/Al_2O_3/Si_3N_4$ film or an $Al_2O_3/HfO_2/Al_2O_3$ film as the high-k film.

Next, the interpoly insulating film 116 in the region other than the region where a memory cell having a FG structure is formed on, e.g., the interpoly insulating film 116 in the region where a select transistor and a control circuit, is selectively removed by etching process so as to expose the surfaces of the FG electrode 109 and the gate electrode 113.

Next, as shown in FIGS. 24A to 24F, a polycrystalline silicon film 117 to be processed into a CG electrode is formed on the entire surface. The thickness of the polycrystalline silicon film 117 is, for example, about 300 nm.

Here, a polycrystalline silicon film is used as a conductive film to be processed into the CG electrode, however, it is also possible to use a polycide film (e.g., laminated film such as $WSi_2$/polycrystalline silicon film or $CoSi_2$/polycrystalline silicon) or a poly-metal film (e.g., W/WN/polycrystalline silicon film) may be used.

Further, as a stepped portion formed by gate electrode 113 of the control circuit section, which is partly protruded from the STI trench, the entire region may planarized by planarizing process such as CMP process before the processing.

Next, as shown in FIGS. 25A to 25F, a mask layer 118 comprising a silicon nitride film ($Si_3N_4$ film) or a silicon oxide film is formed on the polycrystalline silicon film 117. Then, the mask layer 118, the polycrystalline silicon film 113, the polycrystalline silicon film 117, and the interpoly insulating film 116 are. successively processed by the ordinary lithography process and RIE process so as to form the CG electrode 117 in the memory cell section, the gate electrode 117' of the select transistor section, and the gate electrode 113 of the transistor in the control circuit section.

In order to prevent the surface of the silicon substrate 101 from causing etching damage in the etching step of the polycrystalline silicon film 113 to be processed into the gate electrode of the control circuit section, it is necessary to select the conditions of the RIE process such that the etching rate of the gate insulating film ($SiO_2$ film) 112 is rendered sufficiently lower than the etching rate of the polycrystalline silicon film 113.

Next, oxide films (not shown) is formed by oxidizing the side surfaces of the CG electrode 117 in the memory cell section, the gate electrode 117' in the select transistor section, and the gate electrode 113 and the CG electrode 117 of the peripheral transistor.

Next, the source/drain diffusion layers 119 having a low impurity concentration are formed by the ordinary lithography process and ion implantation process. The conductivity type of the source/drain diffusion layers 119 is an $N^-$type in the case of an N-channel transistor and a $P^-$type in the case of a P-channel transistor.

Next, the spacer 121 is formed on the side walls of the gate electrode 113, the CG electrode 117 and the mask layer 118. The spacer 121 is, for example, a TEOS-$SiO_2$ film formed by LP-CVD process.

Next, the source/drain diffusion layers 120 and 122 of the transistors in the memory cell section and the control circuit section, which have high impurity concentrations, are formed by the ordinary lithography process and an ion implantation process. It is possible for the source/drain diffusion layers 120 and 122 to be formed in different process steps or in the same process step.

Known technologies are employed in the subsequent manufacturing process steps. That is, the interlayer insulating film 123 is formed on the entire surface by CVD process, thereafter, the contact hole 124 for the bit line contact plug is formed. Next, the bit line contact plug 125 and bit lines 126 are formed. Next, the interlayer insulating film 127, the contact plug 128 and the wiring layer 129 are formed. And, a passivation film (not shown), a pad (not shown), etc. are formed so as to finish the manufacture of a semiconductor device.

According to the second embodiment, it is possible to obtain prominent effects as summarized below:

(1) Since the FG electrode 109 is buried completely in the trench, the coupling capacitance between the adjacent FG electrodes 109 is reduced.

(2) Since the concave transistor structure is employed, the SCE is suppressed.

(3) Since the diffusion layer having a high impurity concentration is used as the source/drain diffusion layers 120 of the memory cell array, the resistance of the source/drain diffusion layers and the parasitic resistance are lowered, Accordingly, the current for the read out is increased.

(4) Since the area in the lower portion of the first FG electrode 109 is made smaller than the area in the upper portion of the first FG electrode 109 in self-alignment manner, the coupling ratio of (C2/(C1+C2)) is improved, Accordingly, the writing voltage is lowered.

(5) Since the step for forming the single FG is electrode is enough for the process of the FG electrode process, the manufacturing process is simplified.

Incidentally, in the first and second embodiments, the ONO film, $Al_2O_3$ film, $Si_3N_4/Al_2O_3/Si_3N_4$ film, or $Al_2O_3/HfO_2/Al_2O_3$ film are shown as the examples of the interpoly insulating film.

However, an oxide film (monolayer film) containing Al (aluminum), Ta (tantalum), Ti (titanium), Sr (strontium), Hf (hafnium) or Zr (zirconium) as a main component, a laminate film including at least two of these oxide films, a laminate film including the monolayer film and a silicon oxide film (or a silicon nitride film), or a laminate film including the laminate film noted above and a silicon oxide film (or a silicon nitride film) may be used as the interpoly insulating film 116.

The interpoly insulating film 116 will now be described in detail including the thickness of the film.

At first, it is possible to use a hafnium oxide film ($HfO_2$) in place of the $Al_2O_3$ film. The $HfO_2$ film exhibits a dielectric constant of about 20. Therefore, even if the area of the $HfO_2$ film is small, it is possible to secure a large capacitance. It is also possible to use a $Si_3N_4$ film of a single layer structure, which exhibits-a dielectric constant of about 8, in place of the $Al_2O_3$ film. Further, it is possible to use the laminate films given below in place of the $Al_2O_3$ film: A laminate film of $Si_3N_4$ (about 2 nm)/$Ta_2O_5$ (about 20 nm)/$Si_3N_4$ (about 2 nm);

A laminate film of $Si_3N_4$ (about 2 nm)/$SrTiO_3$ (about 30 nm)/$Si_3N_4$ (about 2 nm);

A laminate film of $HfO_2$ (about 10 nm)/ALD-$Al_2O_3$ (about 3 nm);

A laminate film of $Si_3N_4$ (about 2 nm)/Nd-doped $Ta_2O_5$ (about 20 nm)/$Si_3N_4$ (about 2 nm);

A laminate film of $Si_3N_4$ (about 2 nm)/Ti-dopedoped $Ta_2O_5$ (about 20 nm)/$Si_3N_4$ (about 2 nm);

A laminate film of $Si_3N_4$ (about 2 nm)/barium strontium titanium oxide $(Ba, Sr)TiO_3$ (about 20 nm)/$Si_3N_4$ (about 2 nm); and A laminate film of $HfO_2$ (about 10 nm)/$Al_2O_3$ (5 nm)/SiON (1 nm).

As described above, it is possible to obtain the interpoly insulating film by combining a plurality of high-k insulating films. In this case, the coupling capacitance between the CG and FG can be increased.

Figure 31:
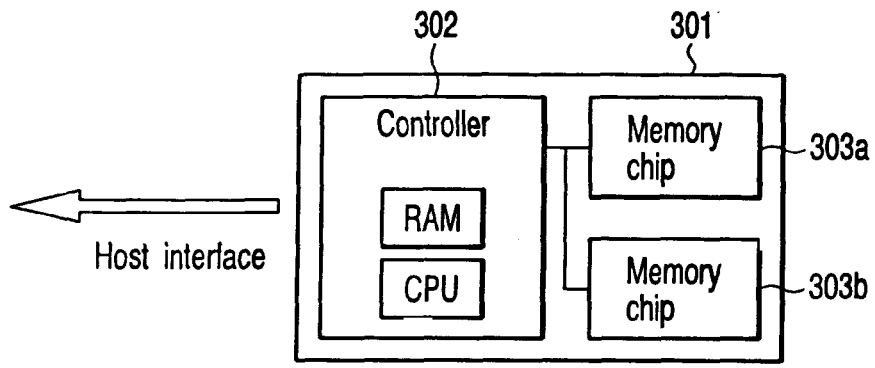
FIG. 31 schematically shows a memory card with the NAND flash memory according to the embodiment.
Figure 32:
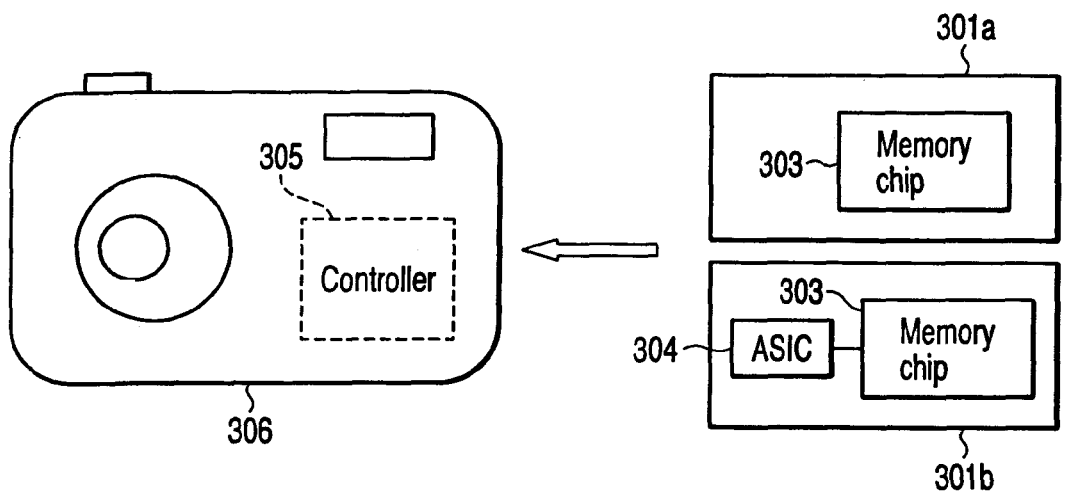
FIG. 32 schematically shows a memory card without a controller.
Figure 33:
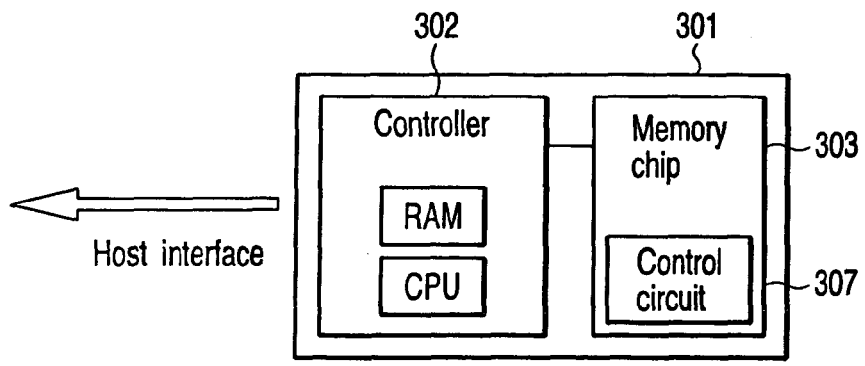
FIG. 33 schematically shows a memory chip with a control circuit.

FIGS. 31 to 33 exemplify the devices comprising the NAND flash memory of the embodiment.

FIG. 31 shows a memory card comprising a controller and embedded chips. The controller 302 and memory chips 303a and 303b are mounted on the memory card 301. The memory chips 303a and 303b comprises the NAND flash memory of the embodiment.

The host interface is, for example, an ATA interface, a PC card interface, and USB. It is possible for the other interfaces to be used as the host interface. The controller 302 includes a RAM and a CPU. It is possible for the controller 302 and the memory chips 303a, 303b to be formed in a single chip or to be formed separately in different chips.

FIG. 32 shows a memory card without the controller. This example is directed to a card 301a having a memory chip 303 alone mounted thereto, or a card 301b having a memory chip 303 and a relatively small scale logic circuit (ASIC) 304 mounted thereto. The memory chip 303 includes the NAND flash memory of the embodiment. The apparatus on the host side, to which the cards 301a and 301b are connected, is, for example, a digital camera 306 equipped with a controller 305.

Further, FIG. 33 shows a memory chip with a control circuit. The controller 302 and a memory chip 33 are mounted on the memory card 301. The memory chip 303 includes-a control circuit 307.

The present invention is not limited to the embodiments described above. For example, in the embodiments, the present invention is applied to the NAND type semiconductor memory device, however, the present invention is also applied to the NOR type semiconductor memory device. The method of manufacturing the NOR type semiconductor memory device is basically equal to the manufacturing method of the NAND type semiconductor memory device except for the connecting relationship of the transistors. Therefore, the effects similar of the embodiments can also be expected in the case of the NOR type flash memory.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device comprising: a substrate including a semiconductor and an electrically rewritable semiconductor memory provided on the substrate, the manufacturing method comprising:
    forming a trench on the surface of the substrate;
    forming first and second insulating films respectively on bottom and side surfaces of the trench;
    forming a charge storage layer, at least a part of the charge storage layer being provided in the trench, and an area of the lower surface of the charge storage layer being smaller than an area of the upper surface of the charge storage layer;
    forming a third insulating film on the charge storage layer; and
    forming a control gate electrode on the third insulating film,
    wherein the forming of the trench comprises
        forming a fourth insulating film on the substrate, and
        forming a trench that penetrates the fourth insulating film and reaches substantially a halfway depth of the substrate, and
    wherein the forming of the first and second insulating films comprises
        forming an insulating film on the bottom surface and side surface of the trench, wherein the side surface of the trench includes sidewalls of the substrate and sidewalls of the fourth insulating film within the trench,
        selectively removing the insulating film from the bottom surface of the trench to expose the substrate while retaining at least a portion of the insulating film on the side surface of the trench as the second insulating film, and
        forming the first insulating film on the exposed substrate at the bottom surface of the trench by oxidation.

2. The method of manufacturing a semiconductor device according to claim 1, wherein the fourth insulating film has a lower oxidizing rate than the substrate.

3. The method of manufacturing a semiconductor device according to claim 1, wherein the fourth insulating film includes a silicon oxide film, and the substrate includes a silicon substrate.

4. The method of manufacturing a semiconductor device according to claim 3, wherein the fourth insulating film further includes a silicon nitride film.

5. The method of manufacturing a semiconductor device according to claim 1, wherein the first insulating film is a tunnel insulating film.

6. The method of manufacturing a semiconductor device according to claim 5, wherein the tunnel insulating film is a laminate film including a silicon oxide film and a silicon nitride film or a film including an aluminum oxide film.

7. The method of manufacturing a semiconductor device according to claim 5, wherein the forming the tunnel insulating film comprises forming a silicon oxide film and nitriding the silicon oxide film.

* * * * *